United States Patent
Kotani et al.

(10) Patent No.: US 9,029,868 B2
(45) Date of Patent: May 12, 2015

(54) SEMICONDUCTOR APPARATUS HAVING NITRIDE SEMICONDUCTOR BUFFER LAYER DOPED WITH AT LEAST ONE OF FE, SI, AND C

(71) Applicant: Fujitsu Limited, Kawasaki-shi, Kanagawa (JP)

(72) Inventors: Junji Kotani, Isehara (JP); Tetsuro Ishiguro, Kawasaki (JP); Atsushi Yamada, Isehara (JP); Norikazu Nakamura, Sagamihara (JP)

(73) Assignee: Fujitsu Limited, Kawasaki (JP)

( * ) Notice: Subject to any disclaimer, the term of this patent is extended or adjusted under 35 U.S.C. 154(b) by 27 days.

(21) Appl. No.: 13/935,821

(22) Filed: Jul. 5, 2013

(65) Prior Publication Data

US 2014/0091313 A1     Apr. 3, 2014

(30) Foreign Application Priority Data

Sep. 28, 2012  (JP) ................................. 2012-218250

(51) Int. Cl.
*H01L 29/15* (2006.01)
*H01L 29/205* (2006.01)

(52) U.S. Cl.
CPC .................................... *H01L 29/205* (2013.01)

(58) Field of Classification Search
CPC ..................... H01L 21/02458; H01L 21/0254; H01L 29/785
USPC ............................................ 257/76; 438/142
See application file for complete search history.

(56) References Cited

U.S. PATENT DOCUMENTS

| | | | | |
|---|---|---|---|---|
| 2010/0019277 A1* | 1/2010 | Hata et al. | | 257/190 |
| 2010/0084742 A1* | 4/2010 | Sazawa et al. | | 257/615 |
| 2011/0297961 A1* | 12/2011 | Bunin et al. | | 257/76 |
| 2012/0126239 A1* | 5/2012 | Keller et al. | | 257/76 |
| 2013/0307027 A1* | 11/2013 | Lu et al. | | 257/194 |

FOREIGN PATENT DOCUMENTS

| | | |
|---|---|---|
| JP | 2002-359256 | 12/2002 |
| JP | 2010-182872 A | 8/2010 |
| JP | 2010-232297 A | 10/2010 |

OTHER PUBLICATIONS

Taiwanese Office Action mailed on Jan. 22, 2015 for corresponding Taiwanese Patent Application No. 102124367 with Partial English Translation, 8 pages.

* cited by examiner

*Primary Examiner* — Jami M Valentine
(74) *Attorney, Agent, or Firm* — Fujitsu Patent Center

(57) ABSTRACT

A semiconductor apparatus includes a substrate; a buffer layer formed on the substrate; a first semiconductor layer formed on the buffer layer; and a second semiconductor layer formed on the first semiconductor layer. Further, the buffer layer is formed of AlGaN and doped with Fe, the buffer layer includes a plurality of layers having different Al component ratios from each other, and the Al component ratio of a first layer is greater than the Al component ratio of a second layer and a Fe concentration of the first layer is less than the Fe concentration of the second layer, the first and second layers being included in the plurality of layers, and the first layer being formed on a substrate side of the second layer.

19 Claims, 21 Drawing Sheets

(a)

(b)

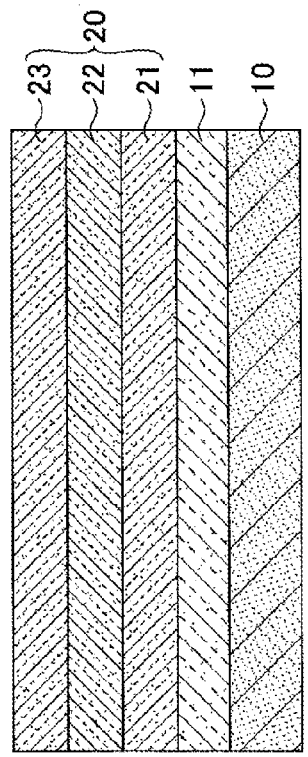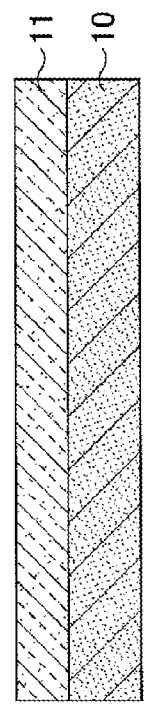

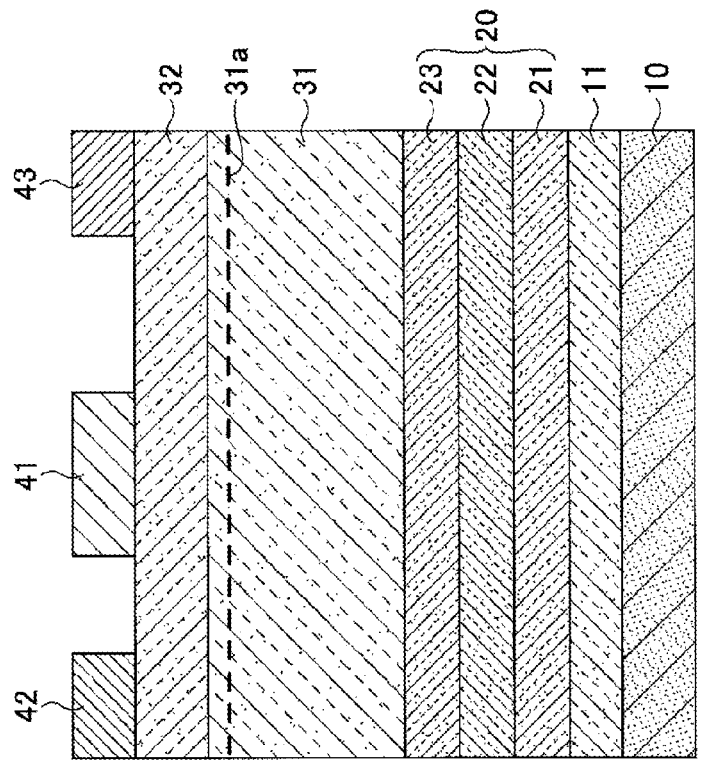

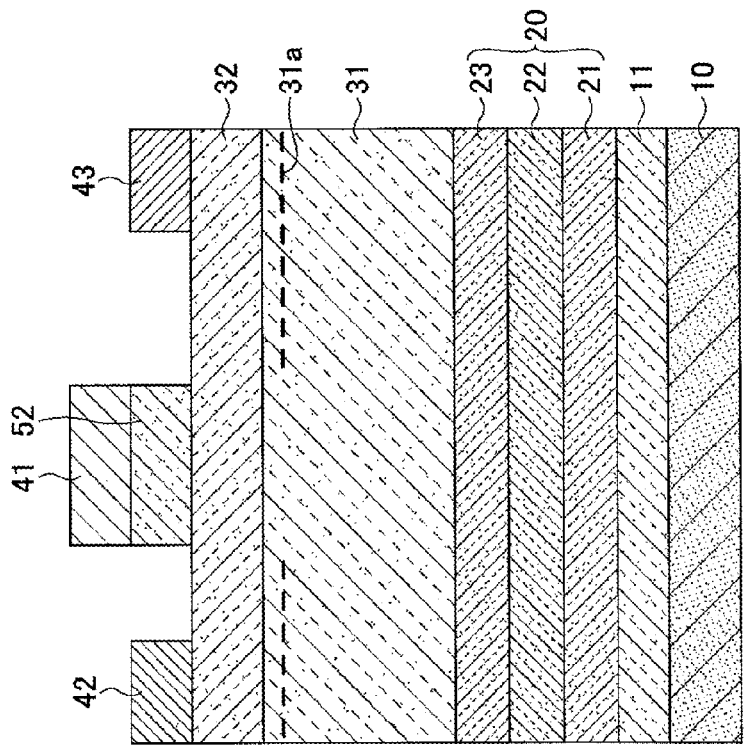
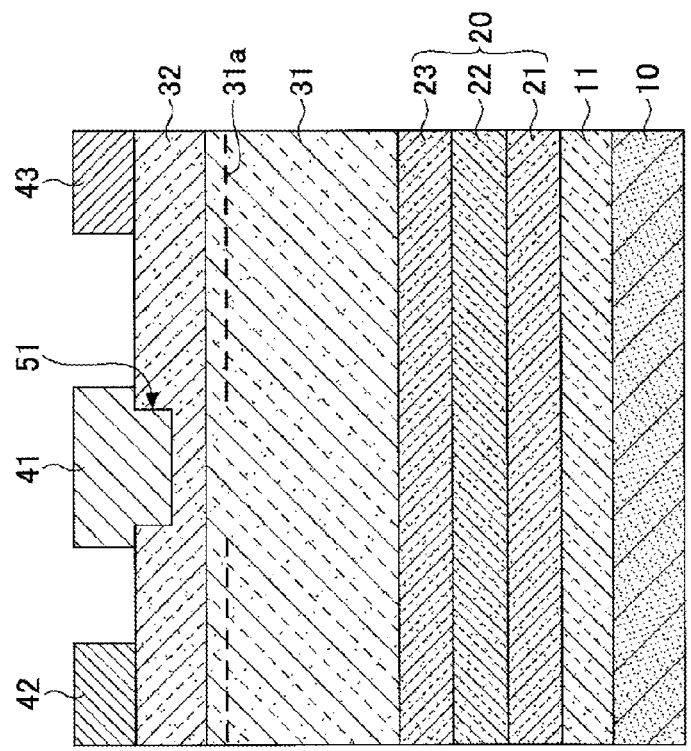

SEMICONDUCTOR APPARATUS HAVING NITRIDE SEMICONDUCTOR BUFFER LAYER DOPED WITH AT LEAST ONE OF FE, SI, AND C

CROSS-REFERENCE TO RELATED APPLICATIONS

This application is based upon and claims the benefit of priority of the prior Japanese Patent Application No. 2012-218250, filed on Sep. 28, 2012, the entire contents of which are incorporated herein by reference.

FIELD

The embodiment discussed herein is related to a semiconductor apparatus.

BACKGROUND

A nitride semiconductor such as GaN, AlN, InN and the like and a material of a mixed crystal thereof may have a wide band gap, so as to be used as a high-power electronic device or a short-wavelength light-emitting device. Among these, research and development has been conducted on the technologies of a Field-Effect Transistor (FET) and especially a High Electron Mobility Transistor (HEMT) as a high-power device (see, for example, Japanese Laid-open Patent Publication No. 2002-359256).

The HEMT using such a nitride semiconductor is used in a high-power and highly-efficient amplifier, a high-power switching device and the like.

For example, the band gap of gallium nitride (GaN), which is one of the nitride semiconductors, is 3.4 eV, which is greater than the band gap (1.1 eV) of Si and the band gap (1.4 eV) of GaAs, so that GaN has higher breakdown field strength. As the HEMT using GaN, there is a HEMT in which the electron transit layer is formed of GaN, the electron supply layer is formed of AlGaN, and an aluminum gallium nitride/gallium nitride (AlGaN/GaN) heterostructure is formed.

Due to the AlGaN/GaN heterostructure, a piezoelectric polarization may be excited due to lattice distortion caused by a difference in lattice constants between AlGaN and GaN. Due to the excited piezoelectric polarization, in the GaN layer, highly-concentrated Two-Dimensional Electron Gas (2DEG) may be generated in a region near the interface (boundary surface) between the AlGaN layer and the GaN layer.

The HEMT using GaN is thought to be used especially in a high-efficiency switching device and a high withstand voltage power device to be useful in an electric vehicle or the like. In such a high withstand voltage power device, from a viewpoint of the circuit design, it is desired to support a normally-off operation.

SUMMARY

According to an aspect, a semiconductor apparatus includes a substrate; a buffer layer formed on the substrate; a first semiconductor layer formed on the buffer layer; and a second semiconductor layer formed on the first semiconductor layer.

Further, the buffer layer is formed of AlGaN and doped with Fe.

Further the buffer layer includes a plurality of layers having different Al component ratios from each other.

Further, the Al component ratio of a first layer is greater than the Al component ratio of a second layer and a Fe concentration of the first layer is less than the Fe concentration of the second layer, the first and second layers being included in the plurality of layers, and the first layer being formed on a substrate side of the second layer.

The objects and advantages of the embodiments disclosed herein will be realized and attained by means of the elements and combinations particularly pointed out in the claims.

It is to be understood that both the foregoing general description and the following detailed description are exemplary and explanatory and are not restrictive of the invention as claimed.

BRIEF DESCRIPTION OF DRAWINGS

FIGS. 6A and 6B illustrate steps in a method of manufacturing the semiconductor apparatus according to the first embodiment;

FIGS. 7A and 7B illustrate other steps in the method of manufacturing the semiconductor apparatus according to the first embodiment;

FIGS. 11A and 11B illustrate example configurations of other semiconductor apparatuses according to the first embodiment;

DESCRIPTION OF EMBODIMENT

In manufacturing HEMTs using a nitride semiconductor, a silicon substrate which is an inexpensive and large-size substrate is typically used due to the requirement of lower cost. However, there are great differences in the lattice constant and the heat expansion coefficient between silicon and a nitride semiconductor material.

Therefore, generally, a buffer layer is formed on the silicon substrate and the nitride semiconductor such as GaN to form a HEMT is formed on the buffer layer.

Figure 1:
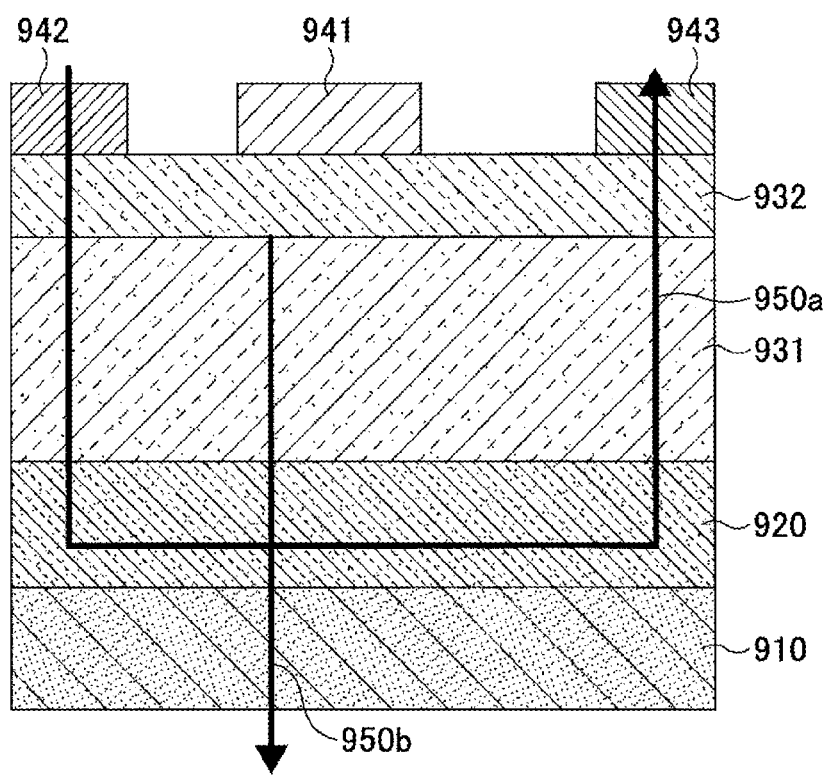
FIG. 1 illustrates a HEMT using GaN in related art.

Specifically, as illustrated in FIG. 1, in the above described HEMT, a buffer layer 920 formed of AlGaN is formed on a silicon substrate 910, and an electron transit layer 931 formed of GaN and an electron supply layer 932 are sequentially formed (laminated) on the buffer layer 920. Further, a gate electrode 941, a source electrode 942, and a drain electrode 943 are formed on the electron supply layer 932

In this case, generally, the buffer layer 920 is formed on the silicon substrate 910 so that the buffer layer 920 has a greater thickness. When a transistor is formed on the buffer layer 920, it may be difficult to control an operation between the source and the drain based on voltage control at the gate electrode 941. Further, a leakage current passing through the buffer layer 920 may occur as illustrated in the arrow 950b.

Further, to drive the transistor, a positive bias voltage is applied to the drain electrode 942. However, in this case, as illustrated in the arrow 950b, a leakage current occurs that flows to the rear side of the silicon substrate 910 via the electron supply layer 932, the electron transit layer 931, and the buffer layer 920.

The leakage current may depend on remaining carriers in the electron supply layer 932, the electron transit layer 931, and the buffer layer 920. Namely, the leakage current amount varies depending on the amount of such remaining carriers.

When the leakage current is large, the power loss is increased and energy consumption is accordingly increased. To resolve the problem, it is desired to provide a semiconductor apparatus using a nitride semiconductor such as GaN as a semiconductor material having lower leakage current.

In the following, embodiments to carry out the invention are described. Here, the same reference numerals are used to describe the same elements, and the repeated descriptions thereof may be omitted.

First Embodiment

To reduce the above-described leakage current, there is a method to increase the resistance of the nitride semiconductor layer such as the buffer layer 920 by doping, with impurity element such as Fe, the nitride semiconductor layer. However, when the impurity element such as Fe as a dopant is injected (doped) into the nitride semiconductor layer such as the buffer layer 920, the crystal property may be degraded and the on-resistance value may be increased.

Figure 2:
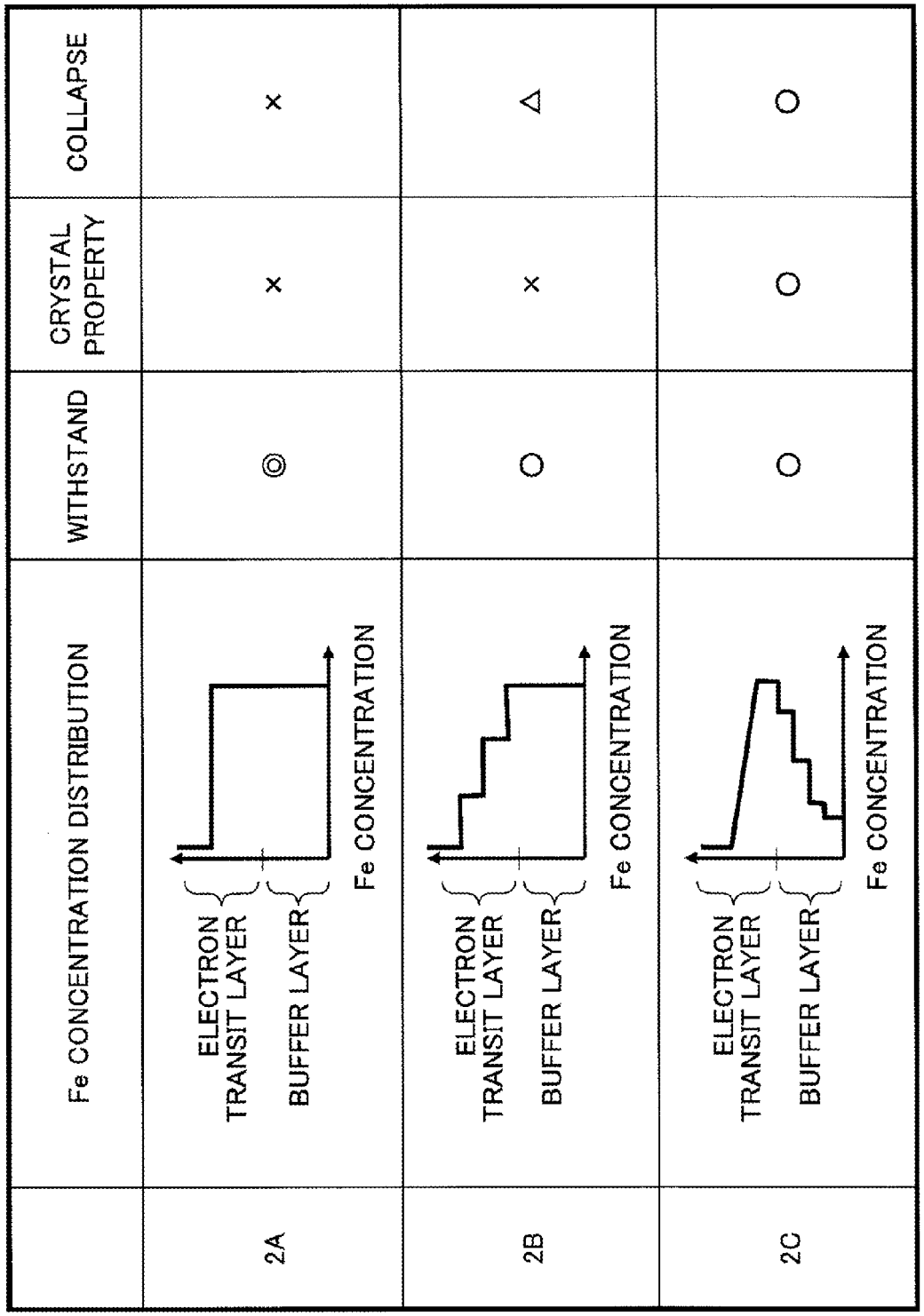
FIG. 2 illustrates a relationship between a concentration distribution of Fe and characteristic items.

FIG. 2 illustrates relationships between Fe concentration distribution when Fe is injected into the buffer layer and the electron transit layer and evaluation items which are withstand, crystal property and Collapse. The term "crystal property" herein refers to the crystal property in the nitride semiconductor including the electron transit layer and the like. The term "Collapse" herein refers to a current collapse phenomenon where the on-resistance value in a higher voltage operation becomes greater than that in a lower voltage operation.

In FIG. 2, as illustrated in a case "2A" where Fe as a dopant is uniformly injected in higher concentration into the buffer layer and the electron transit layer, the withstand voltage is high, but the crystal property is not good, so that the on-resistance becomes high, and the collapse may occur. Further, in a case "2B" where Fe is substantially uniformly injected in higher concentration into the buffer layer and Fe dope amount is gradually decreased in the electron transit layer, the with-stand voltage is relatively high, but the crystal property is not good so that the on-resistance is high and the control of the collapse is not sufficient.

Further, in a case "2C" where Fe dope amount is gradually increased in the buffer layer and is gradually decreased in the electron transit layer, the withstand voltage is relatively high and the crystal property is good so that the on-resistance is low and the collapse is sufficiently controlled.

The crystal property in the electron transit layer and the like may heavily depend on the crystal property of the buffer layer formed on the substrate. Therefore, the crystal property of the electron transit layer where the Fe dope amount is gradually increased is better than the crystal property of the electron transit layer where the Fe is uniformly injected in high concentration.

Further, if Fe is included in a region where electrons transit in the electron transit layer, the on-resistance value is accordingly increased and the collapse becomes remarkable. Therefore, it is preferable that Fe as a dopant is not injected into the region where electrons transit in the electron transit layer. This embodiment is achieved based on this consideration.

Semiconductor Apparatus

A semiconductor apparatus according to the first embodiment is described with reference to FIG. 3. As illustrated in a part (a) of FIG. 3, the semiconductor apparatus in this embodiment includes nitride semiconductor layers, which are a nucleation layer 11, a buffer layer 20, an electron transit layer ("a first semiconductor layer"), an electron supply layer 32 ("a second semiconductor layer") and the like, which are sequentially formed (laminated) on a substrate 10. Further, a gate electrode 41, a source electrode 42, and a drain electrode 43 are formed on the electron supply layer 32.

As the substrate 10, a substrate formed of Si, SiC, sapphire, GaN or the like may be used. The nitride semiconductor layers such as the nucleation layer 11, the buffer layer 20, the electron transit layer 31, the electron supply layer 32 and the like may be formed by Metal Organic Vapor Phase Epitaxy (MOVPE) or Molecular Beam Epitaxy (MBE). In this embodiment, those nitride semiconductor layers are formed by MOVPE.

The nucleation layer 11 is formed of an AlN layer having a thickness of approximately 200 nm. In this embodiment, Fe as a dopant is injected into the nucleation layer 11 with a concentration of approximately $5 \times 10^{17}$ cm$^{-3}$. However, Fe may not be injected into the nucleation layer 11. Further, in this embodiment, the nucleation layer 11 may be described as a part of the buffer layer 20.

The buffer layer 20 is formed of a first buffer layer 21, a second buffer layer 22, and a third buffer layer 23. In this embodiment, the composition of the first buffer layer 21 is $Al_XGa_{1-X}N$, the composition of the second buffer layer 22 is $Al_YGa_{1-Y}N$, and the composition of the third buffer layer 23 is $Al_ZGa_{1-Z}N$, so that the relationship $1>X>Y>Z>0$ is satisfied. Specifically, the first buffer layer 21 is formed of $Al_{0.8}Ga_{0.2}N$, the second buffer layer 22 is formed of $Al_{0.5}Ga_{0.5}N$, and the third buffer layer 23 is formed of $Al_{0.2}Ga_{0.8}N$.

As described, the first buffer layer 21, the second buffer layer 22, and the third buffer layer 23 are formed in a manner such that the composition ratio of Al is sequentially decreased as the distance to the substrate 10 is increased. In this embodiment, the term "composition ratio of Al" refers to a ratio of (the number of) Al atoms to the sum of (the numbers of) Al atoms and Ga atoms. Also, the values X, Y, and Z refers to the corresponding "composition rates of Al".

Figure 3:
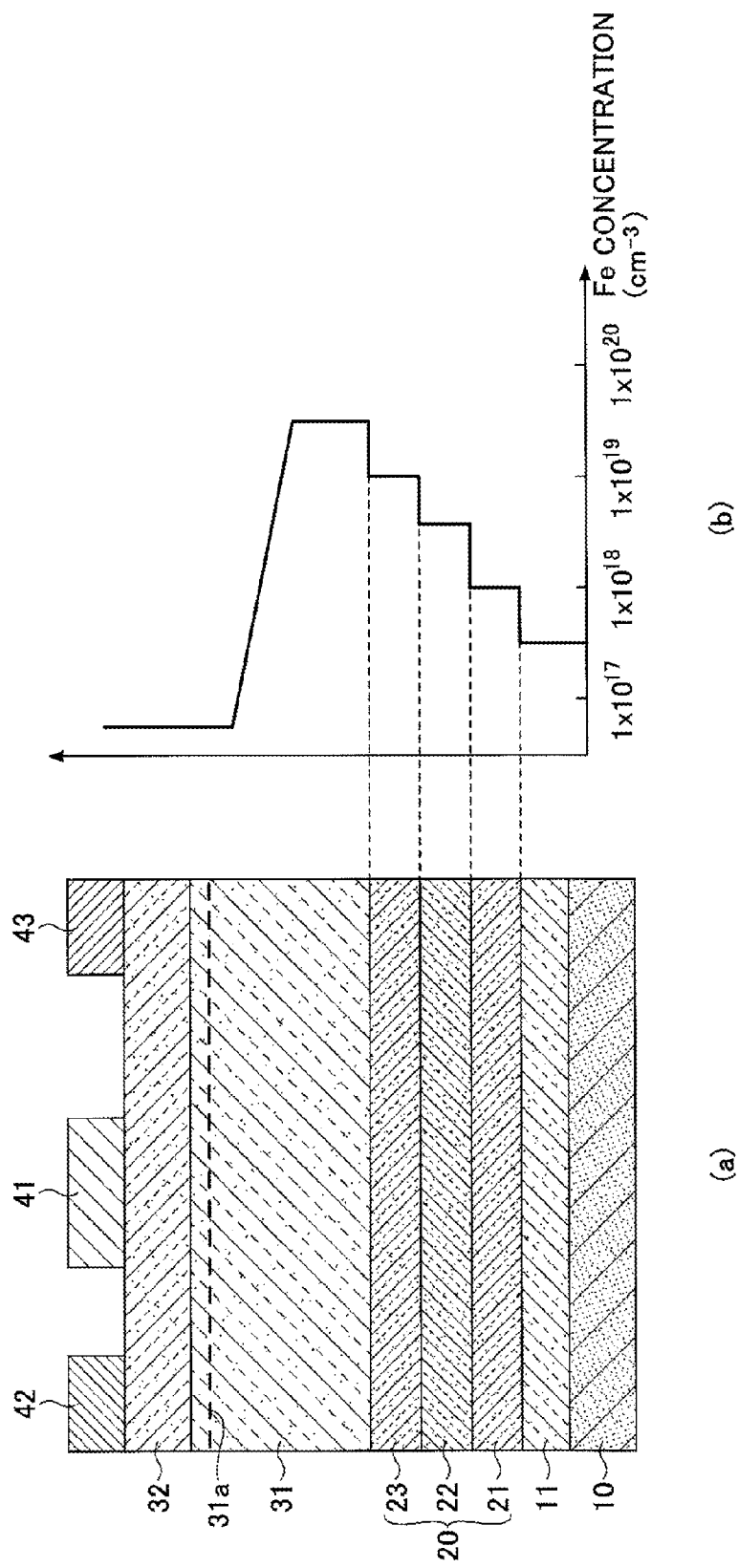
FIG. 3 illustrates an example configuration of a semiconductor apparatus according to a first embodiment.

Further, as illustrated in a part (b) of FIG. 3, the buffer layer 20 is formed in a manner that a formula (Fe concentration in first buffer layer 21)<(Fe concentration in second buffer layer 22)<(Fe concentration in third buffer layer 23) is satisfied. Specifically, Fe is injected into the first buffer layer 21 with a concentration of approximately $1\times10^{18}$ cm$^{-3}$, Fe is injected into the second buffer layer 22 with a concentration of approximately $5\times10^{18}$ cm$^{-3}$, and Fe is injected into the third buffer layer 23 with a concentration of approximately $1\times10^{19}$ cm$^{-3}$.

By doing this, Fe concentration is increased as the distance between the layer and the substrate is increased. Here, preferably, the Fe concentration is greater than or equal to $5\times10^{16}$ cm$^{-3}$ from a viewpoint of preventing the generation of carriers and less than or equal to $2\times10^{20}$ cm$^{-3}$ from a viewpoint of preventing the degradation of the crystal property.

Further, the electron transit layer 31 is formed of GaN, and the electron supply layer 32 is formed of AlGaN. By doing this, in the electron transit layer 31, a 2DEG 31a is formed in a region near the interface between the electron transit layer 31 and the electron supply layer 32.

Further, in this embodiment, Fe is injected into the region in the electron transit layer 31 near the interface between the electron transit layer 31 and the buffer layer 20 with a concentration of approximately $2\times10^{19}$ cm$^{-3}$. Specifically, in the electron transit layer 31, Fe is injected into a region, which includes the interface between the electron transit layer 31 and the buffer layer 20 and has a thickness of approximately 200 nm, with a concentration greater than the Fe concentration in the third buffer layer 23.

Fe is not injected into the entity of the electron transit layer 31. Namely, as described above, it is preferable that the Fe concentration in the region near the interface between the electron transit layer 31 and the electron supply layer 32 is substantially zero (none). Further, as described above, the gate electrode 41, the source electrode 42, and the drain electrode 43 are formed on the electron supply layer 32.

In this embodiment, the buffer layer 20 is formed in a manner that the composition ratio of Al is decreased in the layer arranging order of the first buffer layer 21, the second buffer layer 22, and the third buffer layer 23 as the distance to the substrate 10 is increased.

Further, the buffer layer 20 is formed in a manner that Fe concentration is increased in the layer arranging order of the first buffer layer 21, the second buffer layer 22, and the third buffer layer 23 as the distance to the substrate 10 is increased. Namely, the buffer layer 20 is formed in a manner that the lower the composition ratio of Al becomes, the greater the Fe concentration becomes.

Figure 4:
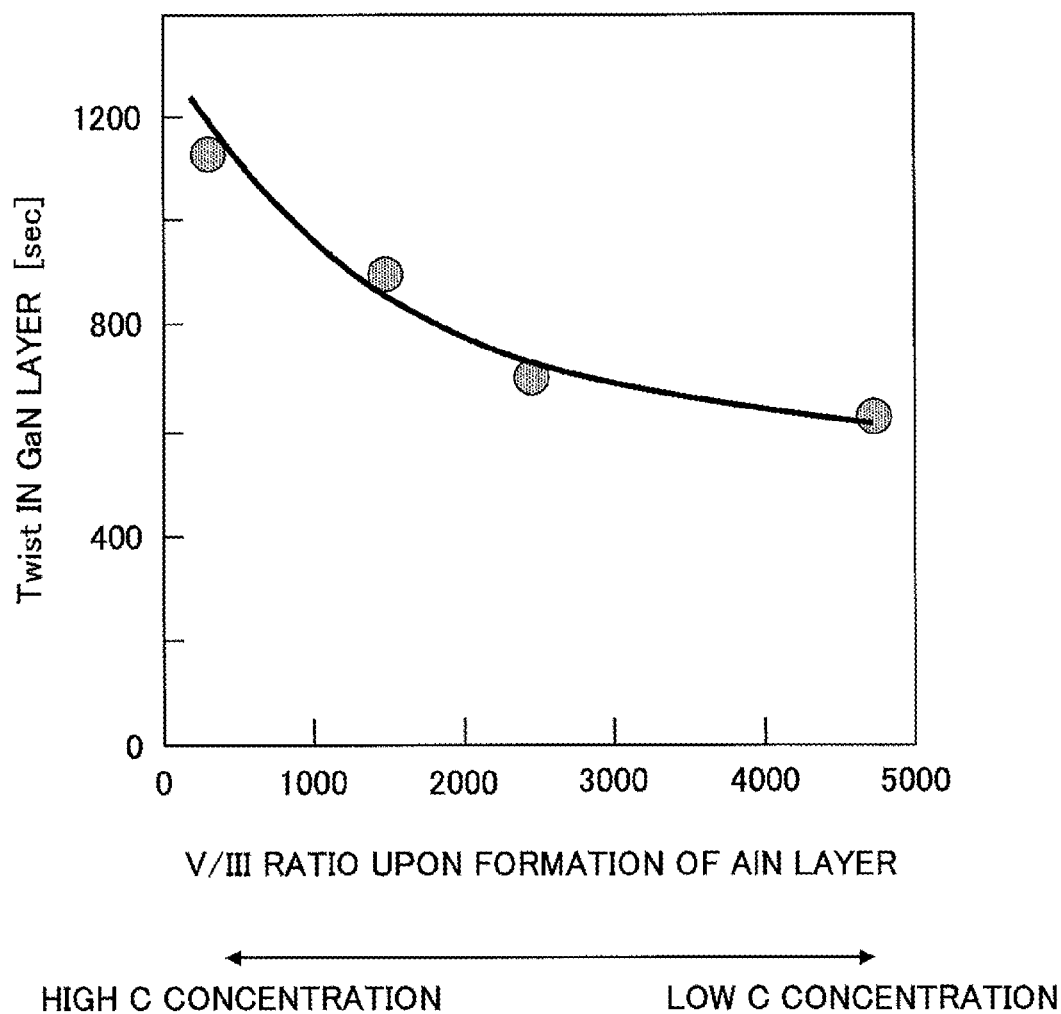
FIG. 4 is a correlation diagram between a V/III ratio and Twist of a GaN layer when an AlN layer is formed.

Here, with reference to FIG. 4, a relationship between the impurity concentration and the crystal property in the nitride semiconductor is described. FIG. 4 illustrates a relationship between a V/III ratio when the AlN layer is formed and Twist in the GaN layer formed on the AlN layer. Here, the term "V/III ratio" refers to a ratio of a group-V source gas to a group-III source gas supplied when the AlN layer is formed by MOVPE.

By changing the V/III ratio upon forming the AlN layer, the concentration of C ("C concentration") included in the AlN layer may be changed. Therefore, based on the relationship of FIG. 4, it may become possible to acquire the C concentration in the AlN layer and the Twist in the GaN layer.

Generally, the lower the V/III ratio is, the higher the C concentration becomes in the formed AlN layer. Further, the higher the V/III ratio is, the lower the C concentration becomes in the formed AlN layer. The term "Twist" in the GaN layer refers to an index indicating a crystal distortion (twist) in the GaN layer and corresponds to a half-band width by the X-ray diffraction.

As the Twist value of the GaN layer is increased, the crystal property is degraded, which may cause a defect level and electron scattering, so that the collapse may become remarkable. Therefore, it is desired that the Twist value of the GaN layer is as low as possible.

When the C concentration in the AlN layer is high, dislocation or the like may frequently occur. As a result, in epitaxial growth, the growth is performed while the dislocations remain. Therefore, as illustrated in FIG. 4, it is supposed that the crystal property may be degraded.

From the viewpoint of the impurity element, C may be thought to be similar to Fe. Therefore, if the concentration of the impurity element in the AlN layer is high, it is thought that the crystal property of the GaN layer is degraded. Therefore, it is desired that the concentration of the impurity element in the nucleation layer 11 and the buffer layer 20 be as low as possible.

Specifically, among the cases illustrated in FIG. 2, it may become possible to form the GaN layer having better crystal property in the case 2C rather than in the cases 2A and 2B. Further, the crystal property may be remarkably degraded when an impurity element is injected into a layer having a higher composition ratio of Al.

Figure 5B:
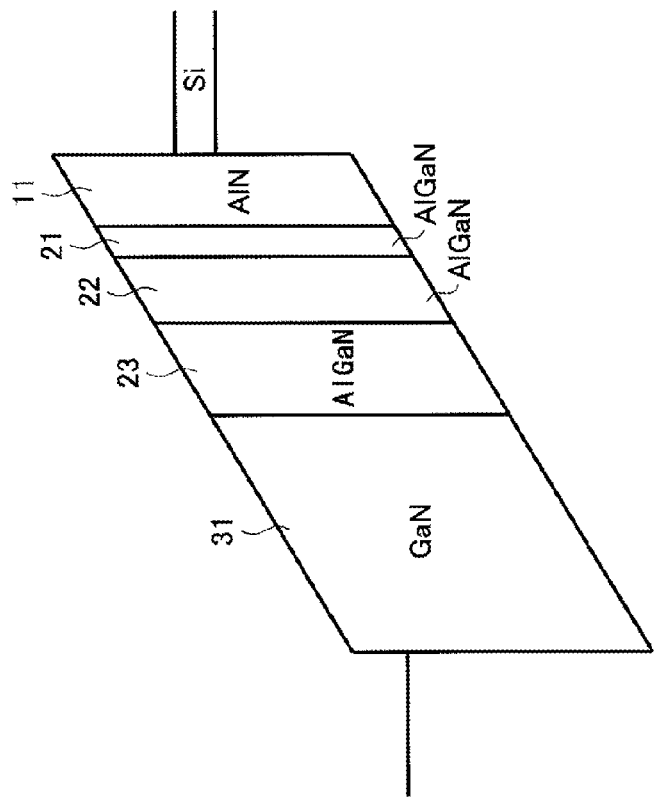
FIGS. 5A and 5B illustrate a leakage current of the semiconductor apparatus according to the first embodiment.
Figure 5A:
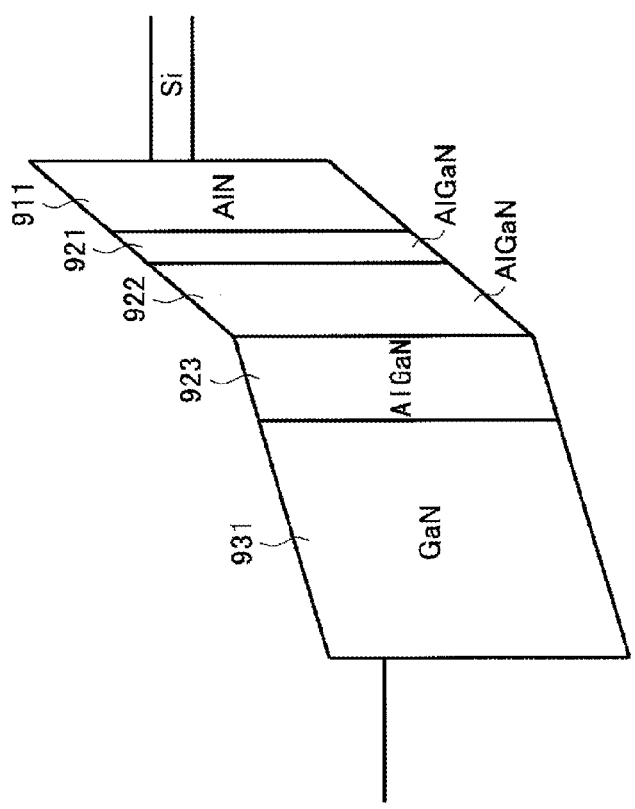

Next, with reference to FIGS. 5A and 5B, the leakage current to the rear surface of the substrate 10 is described. FIG. 5A illustrates a case where a voltage is applied to the layers laminated to each other including an AlN layer 911, a first AlGaN layer 921, a second AlGaN layer 922, a third AlGaN layer 923, and an electron transit layer 931 where Fe as a dopant is not injected into any of the layers. When Fe is not injected, the band gap of the nitride semiconductor having a lower composition ratio of Al is narrow.

Therefore, remaining carriers due to impurity element or defect are more likely to be generated to become n-type. Accordingly, as illustrated in FIG. 5A, an electric field is concentrated on the layers from the AlN layer 911, to the second AlGaN layer 922 or the like, and the bending of the band gets steep. As a result, a tunnel current becomes more likely to flow and the leakage current becomes more likely to flow as well.

On the other hand, in this embodiment, as illustrated in FIG. 5B, the electric field is uniformly formed. Therefore, there is no part where the bending of the band gets steep. Therefore, the tunnel current is unlikely to flow, so that the leakage current may be reduced. Here, it should be noted that the electric field distributions illustrated in FIGS. 5A and 5B where the layers have the same band gap are for explanatory purposes only.

As described above, in the semiconductor apparatus according to this embodiment, it may become possible to reduce (prevent) the leakage current that flows between the source and drain and to the rear surface of the substrate while preventing the degradation of the crystal property. Further, as will be described below, the semiconductor apparatus in this embodiment may have a structure where a recess is formed just under the gate electrode 41 or a p-type GaN layer and the like are included, so as to support the normally-off operation.

Method of Manufacturing Semiconductor Apparatus

Next, a method of manufacturing the semiconductor apparatus according to the first embodiment is described with reference to FIGS. 6A and 6B.

First, as illustrated in FIG. 6A, the nucleation layer 11 is formed on the substrate 10 by epitaxial growth using MOVPE. In this embodiment, the nucleation layer 11 is formed of an AlN layer having a thickness of approximately 200 nm. Further, Fe as the impurity element is injected into the nucleation layer 11 with a concentration of approximately $5\times10^{17}$ cm$^{-3}$.

Next, as illustrated in FIG. 6B, the buffer layer 20 is formed on the nucleation layer 11 by epitaxial growth using MOVPE. The buffer layer 20 is formed of the first buffer layer 21, the second buffer layer 22, and the third buffer layer 23, so that the entire thickness is approximately 500 nm.

In this embodiment, the first buffer layer 21 is formed of $Al_{0.8}Ga_{0.2}N$, and Fe as the impurity element is injected into the first buffer layer 21 with a concentration of approximately $1\times10^{18}$ cm$^{-3}$.

The second buffer layer 22 is formed of $Al_{0.5}Ga_{0.5}N$, and Fe as the impurity element is injected into the second buffer layer 22 with a concentration of approximately $5\times10^{18}$ cm$^{-3}$. The third buffer layer 23 is formed of $Al_{0.2}Ga_{0.8}N$, and Fe as the impurity element is injected into the third buffer layer 23 with a concentration of approximately $1\times10^{19}$ cm$^{-3}$.

Next, as illustrated in FIG. 7A, the electron transit layer 31 and the electron supply layer 32 are formed on the buffer layer 20 by epitaxial growth using MOVPE. The electron transit layer 31 ("first semiconductor layer") is formed of GaN layer having a thickness of approximately 1 μm. The electron supply layer 32 ("second semiconductor layer") is formed of AlGaN layer having a thickness of approximately 20 nm.

Further, Fe as the impurity element is injected into a region in the electron transit layer 31 with a concentration of approximately $2\times10^{19}$ cm$^{-3}$, the region being near (in contact with) the interface, which is between the electron transit layer 31 and the buffer layer 20, and having a thickness of approximately 200 nm. On the other hand, the Fe concentration in a region near the interface between the electron transit layer 31 and the electron supply layer 32 is less than or equal to $1\times10^{17}$ cm$^{-3}$.

In the epitaxial growth by MOVPE, as the source gas of Al, trimethyl aluminum (TMA) is used. As the source gas of Ga, trimethyl gallium (TMG) is used. As the source gas of N, ammonia ($NH_3$) is used. Further, as the source gas of Fe, biscyclopentadienyl iron (Cp2Fe) is used. Further, the source gas is supplied to a chamber of the MOVPE apparatus along with hydrogen ($H_2$) serving as carrier gas.

When the nucleation layer 11 is formed, the pressure in the chamber is set to 5 kPa, the growth temperature is set to 1,000° (degrees Celsius), and the group-III source gas and the group-V source gas are supplied with the V/III ratio (the ratio of a group-V source gas to a group-III source gas) at a range from 1,000 to 2,000.

When the buffer layer 20 is formed, the pressure in the chamber is set to 5 kPs, the growth temperature is set to 1,000° (degrees Celsius), and the group-III source gas and the group-V source gas are supplied with the V/III ratio at a range from 100 to 600. In this case, a predetermined amount of Cp2Fe, which serves as the source gas to dope with Fe, is supplied.

When the electron transit layer 31 is formed, before the Fe is injected into the first 200 nm, the pressure in the chamber is set to 10 kPa, the growth temperature is set to 1,000° (degrees Celsius), and the group-III source gas and the group-V source gas are supplied with the V/III ratio less than or equal to 100.

In this case, a predetermined amount of Cp2Fe, which serves as the source gas to dope with Fe, is supplied at the same time. After that, the supply of Cp2Fe is stopped. Next, when the electron transit layer 31 is further formed, the pressure in the chamber is set to 20 kPa, the growth temperature is set to 1,000° (degrees Celsius), and the group-III source gas and the group-V source gas are supplied with the V/III ratio greater than or equal to 3,000.

When the electron supply layer 32 is formed, the pressure in the chamber is set to 20 kPa, the growth temperature is set to 1,000° (degrees Celsius), and the group-III source gas and the group-V source gas are supplied with the V/III ratio greater than or equal to 3,000.

Next, as illustrated in FIG. 7B, the gate electrode 41, the source electrode 42, and the drain electrode 43 are formed on the electron supply layer 32.

Specifically, first, a photoresist is applied on the electron supply layer 32. Then, by performing an exposition and development process using an exposure device, the resist pattern is formed having openings corresponding to the regions where the source electrode 42 and the drain electrode 43 are to be formed. After that, a metal laminate film formed of Ti/Al (film thickness: Ti: 100 nm and Al: 300 nm) is formed by vacuum evaporation.

Then, the resist pattern and the metal laminate film formed on the resist pattern are dipped in organic solvent so as to be removed (lifted off). By doing this, the source electrode 42 and the drain electrode 43 are formed using the remaining metal laminate film. Then, rapid thermal annealing (RTA) is performed at a temperature of approximately 600° (degrees Celsius) to form ohmic contact.

Further, after that, another photoresist is applied on the electron supply layer 32. Then, by performing the exposition and development process using the exposure device, the resist pattern is formed having an opening corresponding to a region where the gate electrode 41 is to be formed.

After that, a metal laminate film formed of Ni/Au (film thickness: Ni:50 nm and Au:300 nm) is formed by vacuum evaporation. Then, the resist pattern and the metal laminate film formed on the resist pattern are dipped in organic solvent so as to be removed (lifted off). By doing this, the gate electrode 41 is formed using the remaining metal laminate film.

By doing this, the semiconductor apparatus according to this embodiment may be manufactured.

Modified Example

Figure 8:
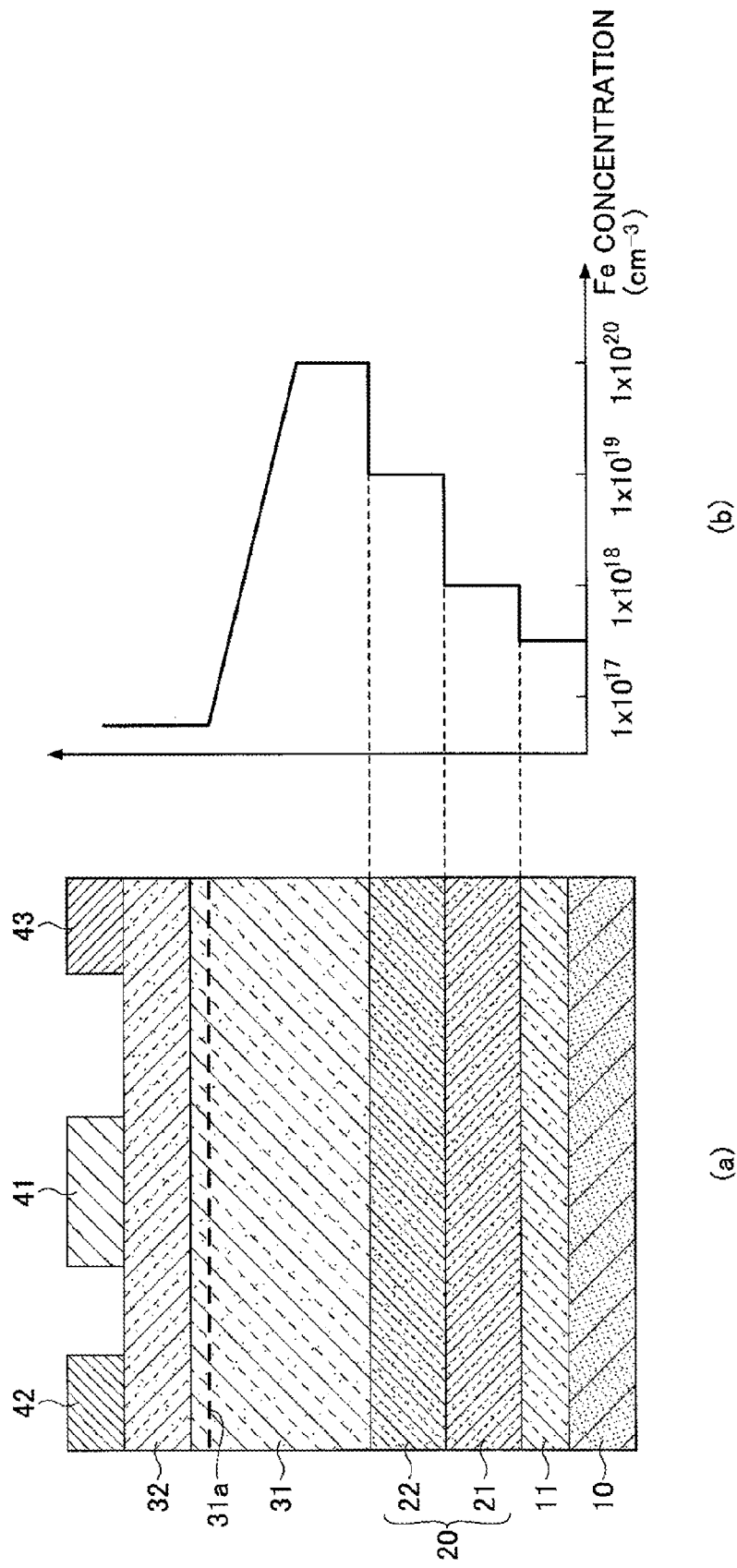
FIG. 8 illustrates a modified example configuration of a semiconductor apparatus according to the first embodiment.

Next, modified examples in this embodiment are described. First, as illustrated in FIG. 8, in the semiconductor apparatus in this embodiment, the buffer layer 20 may include two layers (i.e., a first buffer layer 21 and a second buffer layer 22) having different component ratios of Al ("Al component ratios") and Fe concentration ratios from each other. As described above, the buffer layer 20 is formed in a manner that the first buffer layer 21 has higher component ratio of Al ("Al component ratio") and lower Fe concentration than those of the second buffer layer 22.

Even in this configuration, it may become possible to lower the leakage current while preventing the degradation of the crystal property. Further, in the semiconductor apparatus according to this embodiment, the buffer layer 20 may be formed of a plurality of layers having the same component ratio of Al with each other and different Fe concentration ratios from each other.

Figure 9:
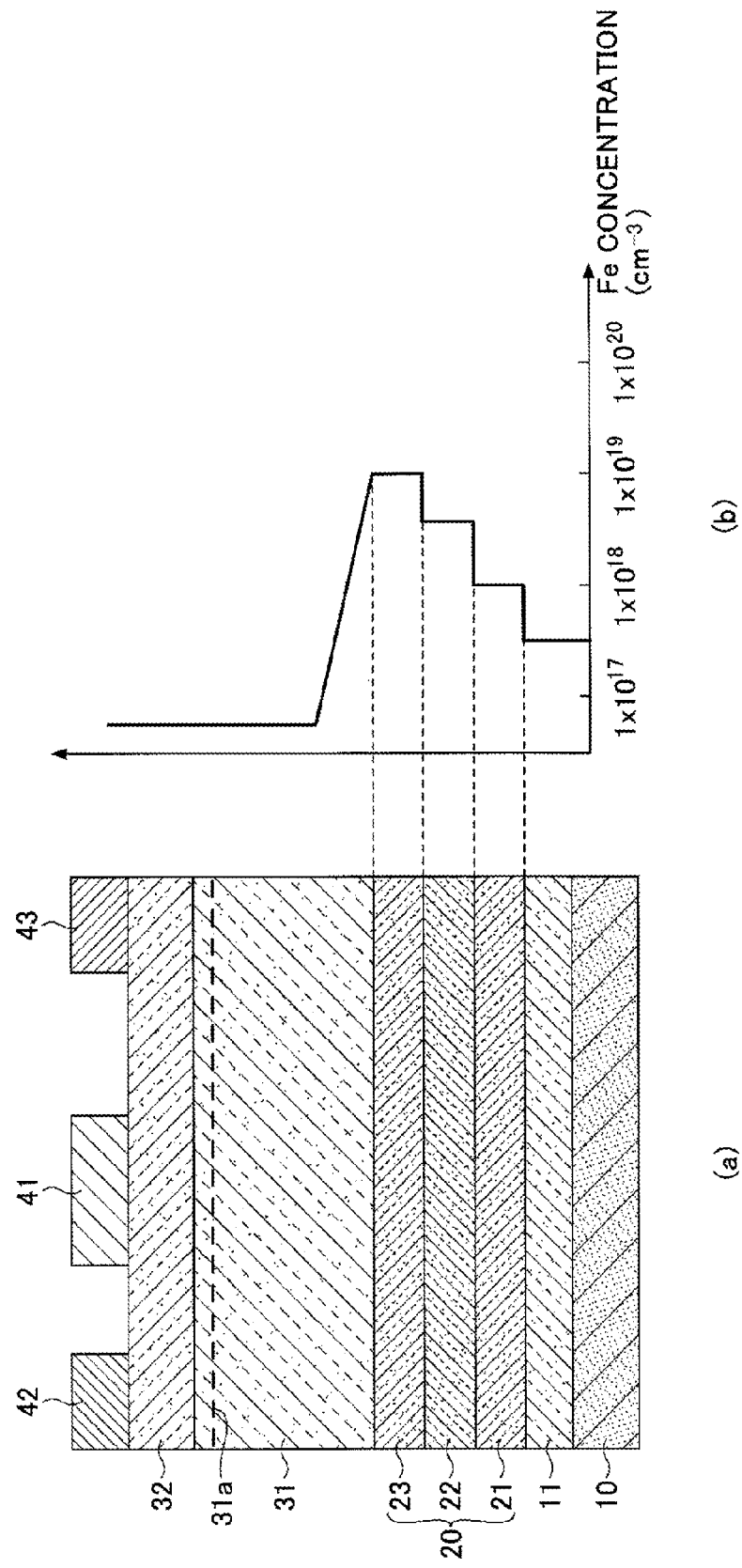
FIG. 9 illustrates another modified example configuration of a semiconductor apparatus according to the first embodiment.

Next, as illustrated in FIG. 9, in the semiconductor apparatus according to this embodiment, Fe as a dopant may be injected into the buffer layer 20 but practically Fe may not be injected into the electron transit layer 31. Even in this configuration, it may become possible to lower the leakage current while preventing the degradation of the crystal property.

Further, in the semiconductor apparatus according to this embodiment, the buffer layer 20 may be formed of a plurality of layers having different Fe concentration ratios from each other. Further, due to diffusion of Fe from the buffer layer 20 to the electron transit layer 31, there may exist diffused Fe in a region of the electron transit layer 31 near the interface between the electron transit layer 31 and the buffer layer 20.

Figure 10:
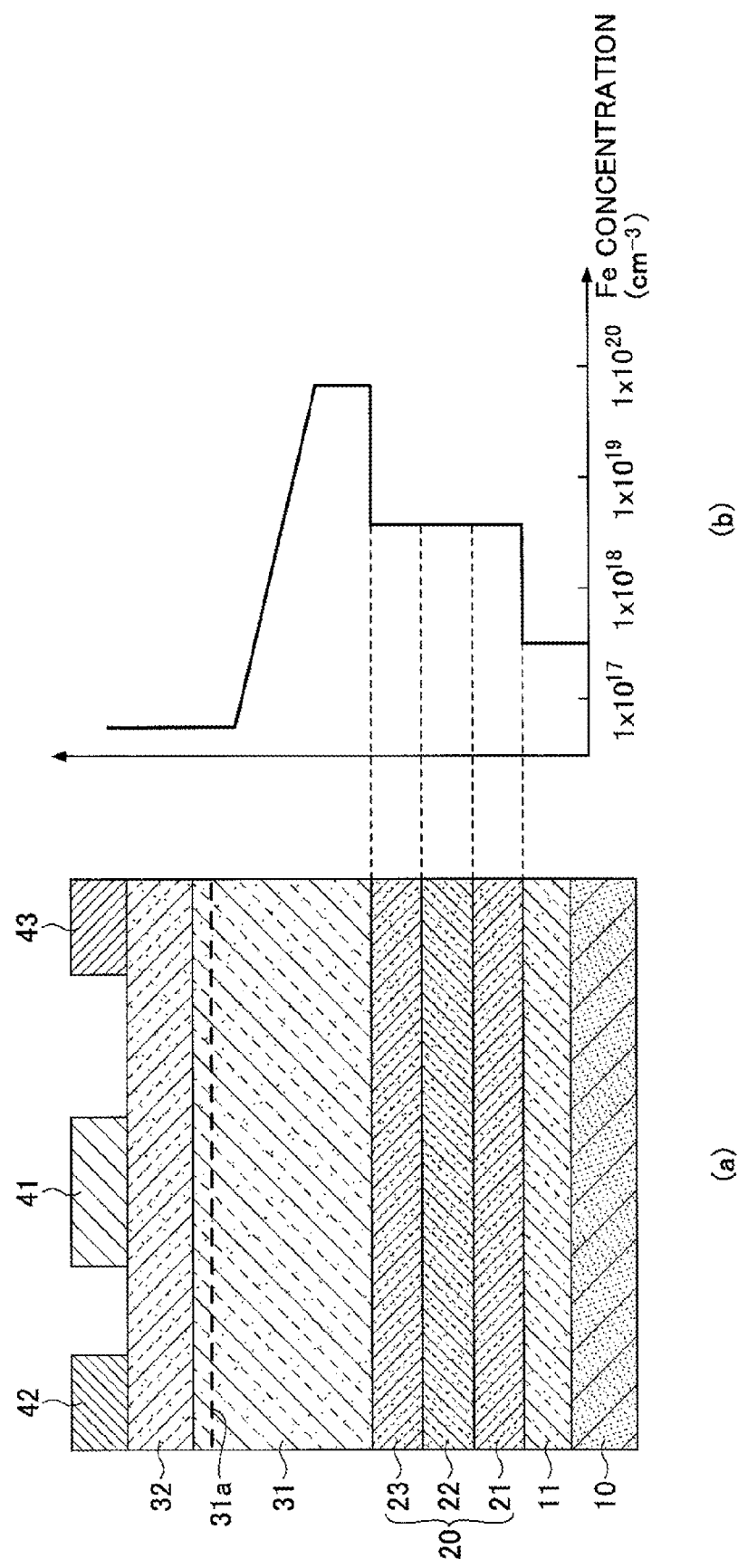
FIG. 10 illustrates still another modified example configuration of a semiconductor apparatus according to the first embodiment.

Further, as illustrated in FIG. 10, in the semiconductor apparatus in this embodiment, when the Fe is injected into a part of the electron transit layer 31, the buffer layer 20 may be formed in a manner that the Fe concentration in the buffer layer 20 may be constant.

In this case, the buffer layer 20 is formed in a manner that the constant Fe concentration in the buffer layer 30 is less than the Fe concentration in a region of the electron transit layer 31 near the interface between the buffer layer 30 and the electron transit layer 31. Even in this configuration, there exist a plurality of layers having different Fe concentration ratios from each other. Therefore, the effect according to this embodiment may also be acquired.

Further, as illustrated in FIG. 11A, a recess 51 may be formed just under the gate electrode 41 by removing a part of the electron supply layer 32, so that the 2DEG 31a is eliminated just under the gate electrode 41 to achieve a normally-off operation.

Further, as illustrated in FIG. 11B, a p-GaN layer 52 may be formed between the electron supply layer 32 and the gate electrode 41. By doing this, similarly, it may become possible to eliminate the 2DEG 31a just under the gate electrode 41 and achieve a normally-off operation.

Second Embodiment

Figure 12:
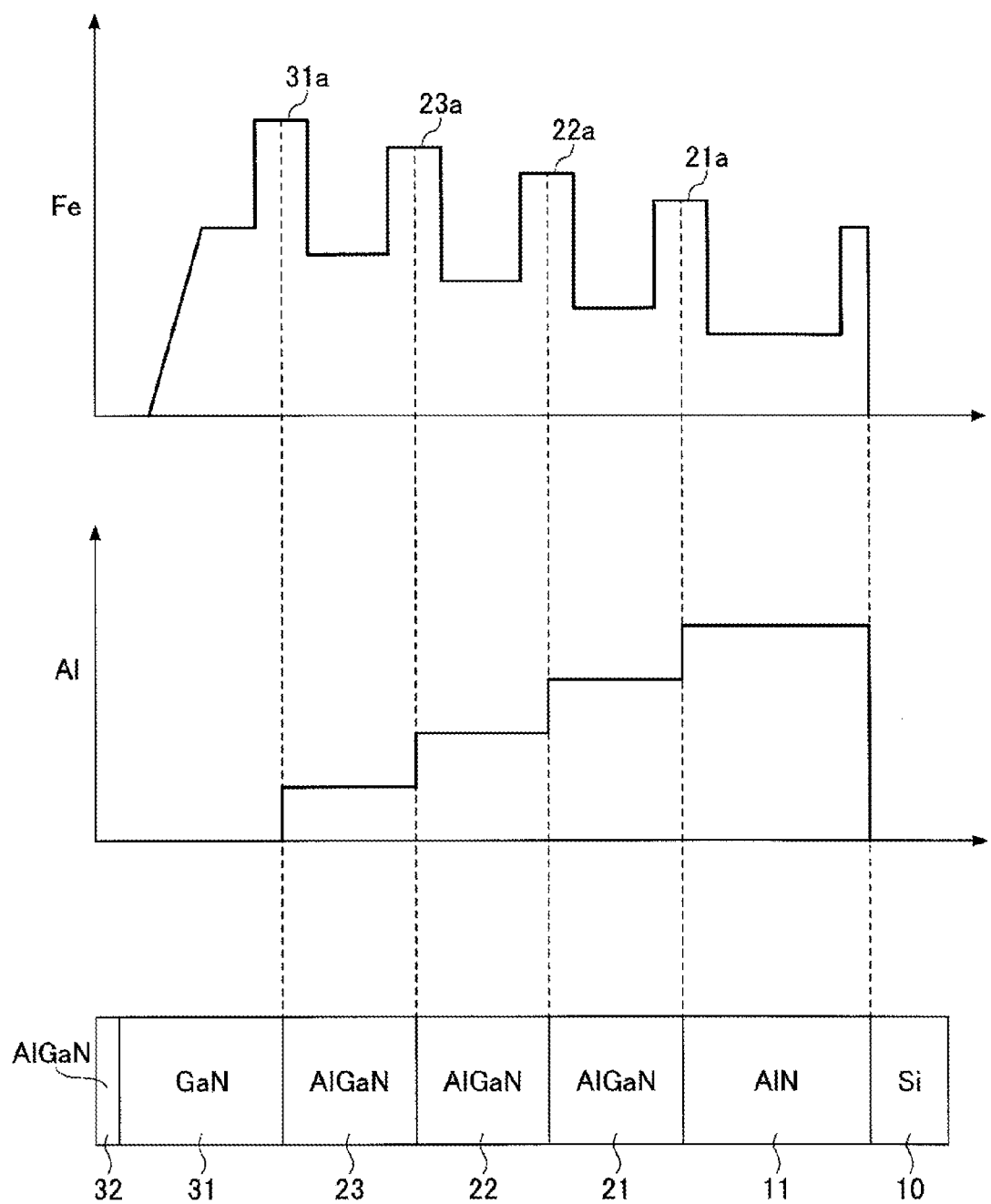
FIG. 12 illustrates a semiconductor apparatus according to a second embodiment.

Next, a second embodiment is described. As illustrated in FIG. 12, in a semiconductor apparatus according to the second embodiment, the nucleation layer 11, the first buffer layer 21, the second buffer layer 22, the third buffer layer 23, the electron transit layer 31 and the like are formed in a manner that the Fe concentration is higher in the interfaces between the nucleation layer 11 and the first buffer layer 21, between the first buffer layer 21 and the second buffer layer 22, between the second buffer layer 22 and the third buffer layer 23, and between the third buffer layer 23 and the electron transit layer 31.

In the interface between two layers having different component ratios of Al from each other, due to difference in lattice constants, carriers are highly likely to be generated. Therefore, by increasing the Fe concentration in such regions where carriers are highly likely to be generated as described above, the carrier generation may be prevented. This is because, in this embodiment, the regions including the interface between two layers having different component ratios of Al and where Fe is doped with higher concentration are formed.

In this embodiment, the nucleation layer 11 is formed of AlN which is doped with Fe at a concentration of approximately $5 \times 10^{17}$ cm$^{-3}$. The first buffer layer 21 is formed of $Al_{0.8}Ga_{0.2}N$ with Fe concentration of approximately $1 \times 10^{18}$ cm$^{-3}$. There is formed a region 21a including the interface between the nucleation layer 11 and the first buffer layer 21. Fe is injected into the region 21a with a concentration of approximately $1 \times 10^{19}$ cm$^{-3}$. The thickness of the region 21a doped with higher concentration of Fe is in a range from 30 nm to 50 nm.

The second buffer layer 22 is formed of $Al_{0.5}Ga_{0.5}N$ with Fe dopant concentration of approximately $5 \times 10^{18}$ cm$^{-3}$. There is formed a region 22a including the interface between the first buffer layer 21 and the second buffer layer 22. Fe is injected into the region 22a with a concentration of approximately $5 \times 10^{19}$ cm$^{-3}$. The thickness of the region 22a doped with a higher concentration of Fe is in a range from 30 nm to 50 nm.

The third buffer layer 23 is formed of $Al_{0.2}Ga_{0.8}N$ with Fe dopant concentration of approximately $1 \times 10^{19}$ cm$^{-3}$. There is formed a region 23a including the interface between the second buffer layer 22 and the third buffer layer 23. Fe is injected into the region 23a with a concentration of approximately $1 \times 10^{20}$ cm$^{-3}$. The thickness of the region 23a doped with a higher concentration of Fe is in a range from 30 nm to 50 nm.

Further, there is formed a region in the electron transit layer 31. The thickness of the region is approximately 200 nm. Further, the region includes (started from) the interface between the electron transit layer 31 and the buffer layer 20. Fe is injected into the region with a concentration of approximately $2 \times 10^{19}$ cm$^{-3}$.

Further, there is formed a region 31a including the interface between the electron transit layer 31 and the buffer layer 20. Fe is injected into the region 31a with a concentration of approximately $2 \times 10^{20}$ cm$^{-3}$. The thickness of the region 23a doped with a higher concentration of Fe is in a range from 30 nm to 50 nm.

As a method of increasing the Fe concentration in the interfaces between layers, a supply amount of the source gas for Fe may be increased at the timings when the corresponding interfaces are formed. By doing this, the semiconductor apparatus in this embodiment may be manufactured. All the steps in this embodiment other than the above are the same as those in the first embodiment.

Third Embodiment

Figure 13:
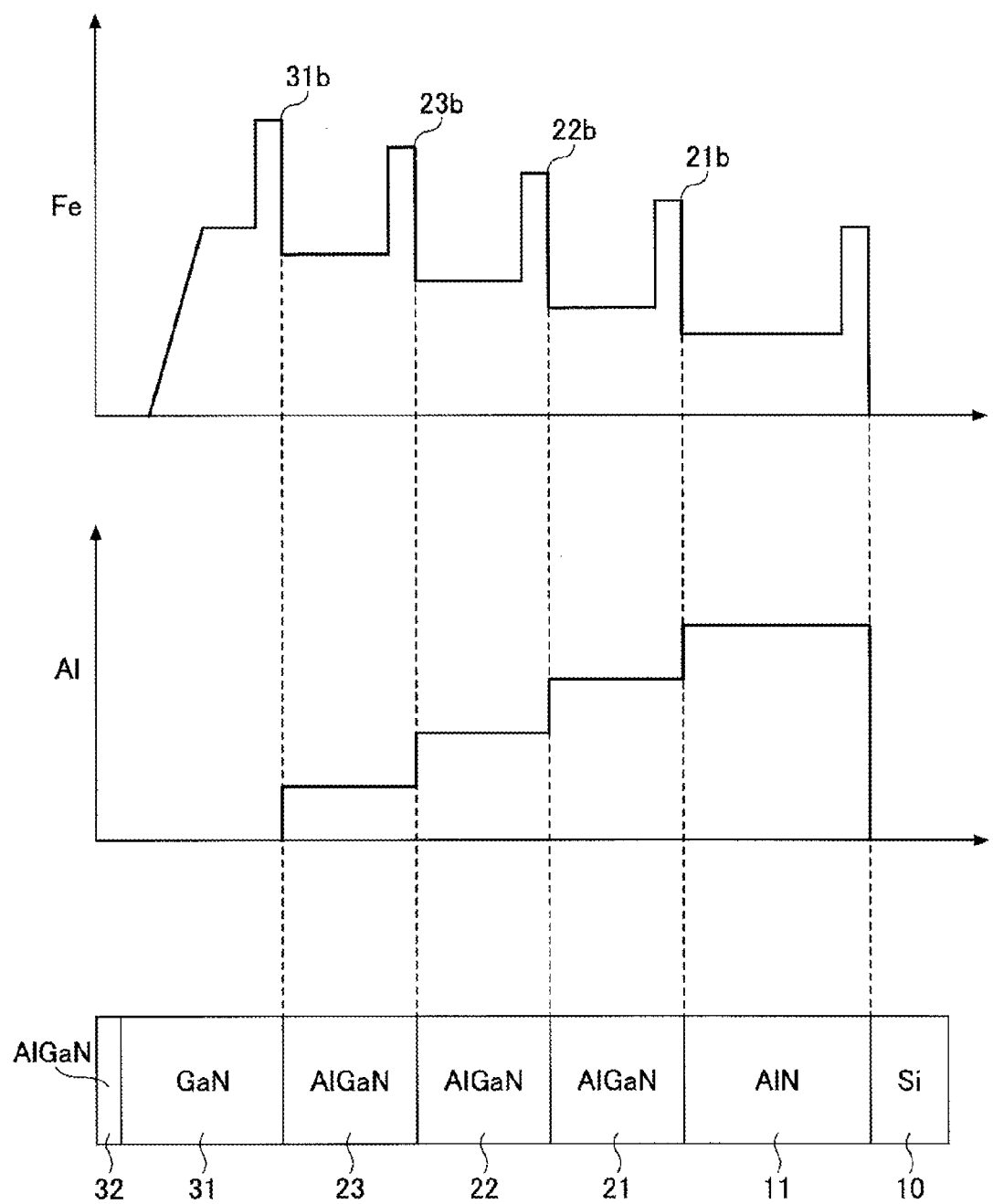
FIG. 13 illustrates a semiconductor apparatus according to a third embodiment.
Figure 14:
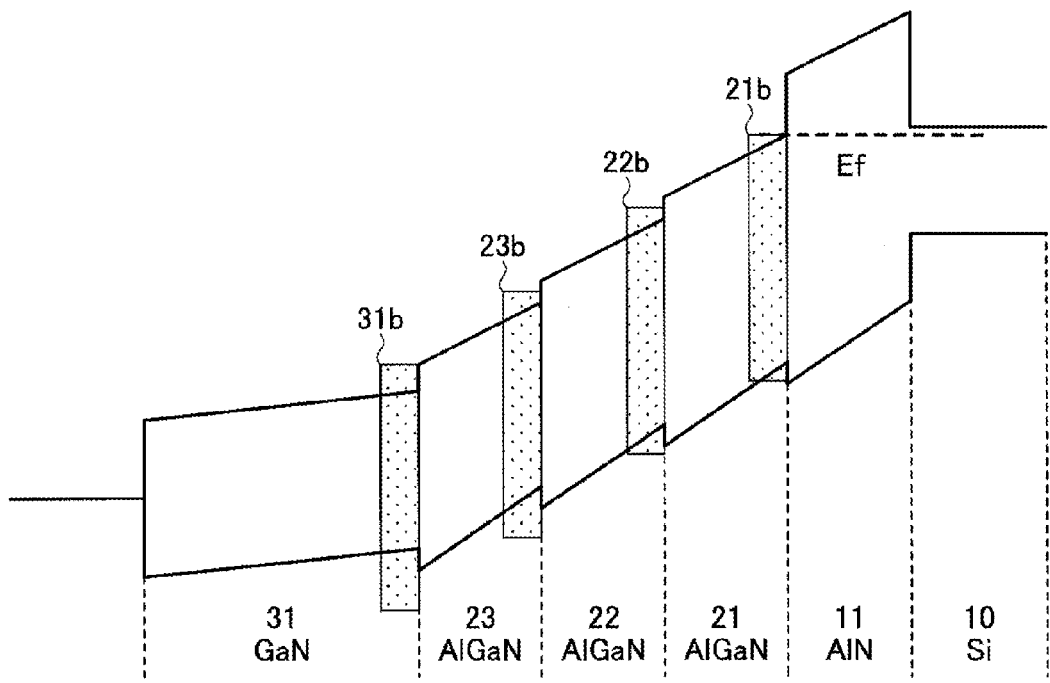
FIG. 14 is an example energy band diagram of a semiconductor apparatus according to the third embodiment.

Next, a third embodiment is described. In the semiconductor apparatus in this embodiment, as illustrated in FIGS. 13 and 14, Fe concentration is set higher in a region which starts from the interface between two layers and extends only in the layer having a narrower band gap. There are regions 21b, 22b, 23b, and 31b which are formed from the interfaces formed between adjacent two layers including the nucleation layer 11, the first buffer layer 21, the second buffer layer 22, the third buffer layer 23, the electron transit layer 31 and the like.

Specifically, those layers are formed in a manner that Fe concentration is higher in the first buffer layer 21 on the nucleation layer 11 side, in the second buffer layer 22 on the first buffer layer 21 side, in the third buffer layer 23 on the second buffer layer 22 side, and in the electron transit layer 31 on the third buffer layer 23 side.

As described above, at the interface between two layers having different component ratios of Al, due to the difference in lattice constants therebetween, carriers are likely to be generated. Especially, carriers are more likely to be generated on the side of the layer whose band gap is narrower.

Therefore, by increasing the Fe concentration in the region where the carriers are more likely to be generated, the carrier generation may be more effectively prevented. To that end, in this embodiment, the regions having higher Fe dopant concentration are formed near the interface in the layer having narrower band gap.

In this embodiment, the nucleation layer 11 is formed of AlN which is doped with Fe at a concentration of approximately $5 \times 10^{17}$ cm$^{-3}$. The first buffer layer 21 is formed of $Al_{0.8}Ga_{0.2}N$ with Fe doped concentration of approximately $1 \times 10^{18}$ cm$^{-3}$. In the first buffer layer 21, in the vicinity of the interface between the nucleation layer 11 and the first buffer layer 21, there is formed a region 21b where Fe is highly doped with a concentration of $1 \times 10^{19}$ cm$^{-3}$. The thickness of the region 21b is in a range from 30 nm to 50 nm.

Further, the second buffer layer 22 is formed of $Al_{0.5}Ga_{0.5}N$ with Fe dopant concentration of approximately $5 \times 10^{18}$ cm$^{-3}$. In the second buffer layer 22, in the vicinity of the interface between the first buffer layer 21 and the second buffer layer 22, there is formed a region 22b that is highly doped with Fe at a concentration of $5 \times 10^{19}$ cm$^{-3}$. The thickness of the region 22b is in a range from 30 nm to 50 nm.

Further, the third buffer layer 23 is formed of $Al_{0.2}Ga_{0.8}N$ with Fe dopant concentration of approximately $1\times10^{19}$ $cm^{-3}$. In the third buffer layer 23, in the vicinity of the interface between the second buffer layer 22 and the third buffer layer 23, there is formed a region 23b that is highly doped with Fe at a concentration of $1\times10^{20}$ $cm^{-3}$. The thickness of the region 23b is in a range from 30 nm to 50 nm.

Further, in the electron transit layer 31, there is a region which starts from the interface between the buffer layer 20 and the electron transit layer 31, and extends in the electron transit layer 31. The thickness of this region is approximately 200 nm. This region is doped with a Fe concentration of approximately $2\times10^{19}$ $cm^{-3}$. Further, this is another region 31b in the electron transit layer 31.

The region 31b also starts from the interface between the buffer layer 20 and the electron transit layer 31, and extends in the electron transit layer 31. The region 31b is highly doped with a Fe concentration of $2\times10^{20}$ $cm^{-3}$. The thickness of the region 31b is in a range from 30 nm to 50 nm.

As a method of forming the regions highly doped with Fe, for example, there is a method in which the supply amount of the source gas for Fe is increased at each of the timings when new layers are formed having different composition ratios from those before. By doing this, the semiconductor apparatus in this embodiment may be manufactured. All the steps in this embodiment other than the above are the same as those in the first embodiment.

Fourth Embodiment

Figure 15:
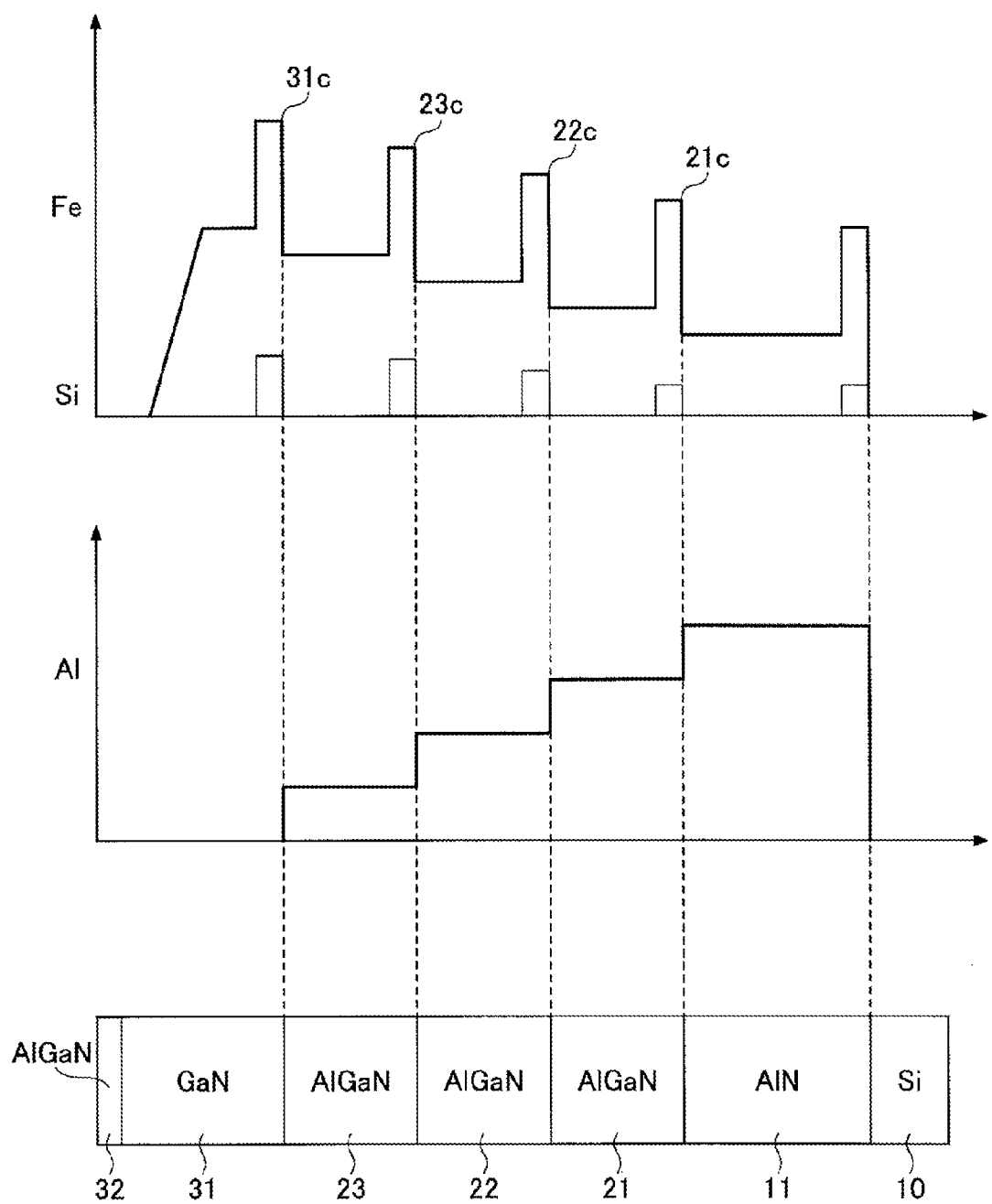
FIG. 15 illustrates a semiconductor apparatus according to a fourth embodiment.

Next, a fourth embodiment is described. In the semiconductor apparatus according to this embodiment, as illustrated in FIG. 15, not only Fe but also Si are injected as dopants in the fourth embodiment.

As described above, at the interface between two layers having different component ratios of Al, due to the difference in lattice constants therebetween, carriers are likely to be generated. Generally, the carriers that are generated in this case are electrons.

However, holes may be generated. Silicon (Si) is an n-type impurity element. Therefore, in this embodiment, by doping with Si, the generation of holes may be prevented. However, if Si doping is too much, the excess holes may become sources to supply electrons. Therefore, preferably, Si dopant concentration be less than or equal to $2\times10^{17}$ $cm^{-3}$.

In this embodiment, the nucleation layer 11 is formed of AlN with Fe dopant concentration of approximately $5\times10^{17}$ $cm^{-3}$. The first buffer layer 21 is formed of $Al_{0.8}Ga_{0.2}N$ with Fe doped concentration of approximately $1\times10^{18}$ $cm^{-3}$.

In the first buffer layer 21, in the vicinity of the interface between the nucleation layer 11 and the first buffer layer 21, there is formed a region 21c that is doped with a Fe concentration of $1\times10^{19}$ $cm^{-3}$ and is doped with a Si concentration of $2\times10^{17}$ $cm^{-3}$ or less. The thickness of the region 21c is in a range from 30 nm to 50 nm.

Further, the second buffer layer 22 is formed of $Al_{0.5}Ga_{0.5}N$ with Fe dopant concentration of approximately $5\times10^{18}$ $cm^{-3}$. In the second buffer layer 22, in the vicinity of the interface between the first buffer layer 21 and the second buffer layer 22, there is formed a region 22c that is doped with a Fe concentration of approximately $1\times10^{19}$ $cm_{-3}$ and is doped with a Si concentration of $2\times10^{17}$ $cm_{-3}$ or less. The thickness of the region 22c is in a range from 30 nm to 50 nm.

Further, the third buffer layer 23 is formed of $Al_{0.2}Ga_{0.8}N$ with Fe dopant concentration of approximately $1\times10^{19}$ $cm_{-3}$. In the third buffer layer 23, in the vicinity of the interface between the second buffer layer 22 and the third buffer layer 23, there is formed a region 23c that is doped with a Fe concentration of $1\times10^{19}$ $cm_{-3}$ and is doped with a Si concentration of $2\times10^{17}$ $cm_{-3}$ or less. The thickness of the region 23c is in a range from 30 nm to 50 nm.

Further, in the electron transit layer 31, there is a region which starts from the interface between the buffer layer 20 and the electron transit layer 31, and extends into the electron transit layer 31. The thickness of this region is approximately 200 nm. This region is doped with a Fe concentration of approximately $2\times10^{19}$ $cm_{-3}$. Further, there is another region 31c in the electron transit layer 31. The region 31c also starts from the interface between the buffer layer 20 and the electron transit layer 31, and extends in the electron transit layer 31. The region 31c is doped with a Fe concentration of approximately $1\times10^{19}$ $cm_{-3}$ and is doped with a Si concentration of $2\times10^{17}$ $cm_{-3}$ or less. The thickness of the region 31c is in a range from 30 nm to 50 nm.

As a method of forming the regions doped with Fe and Si, there is a method in which the supply amount of the source gas for Fe is increased and $SiH_4$ for doping with Si is simultaneously supplied at each of the timings when the regions are formed with Fe and Si doping. By doing this, the semiconductor apparatus in this embodiment may be manufactured. All the steps in this embodiment other than the above are the same as those in the third embodiment.

Fifth Embodiment

Figure 16:
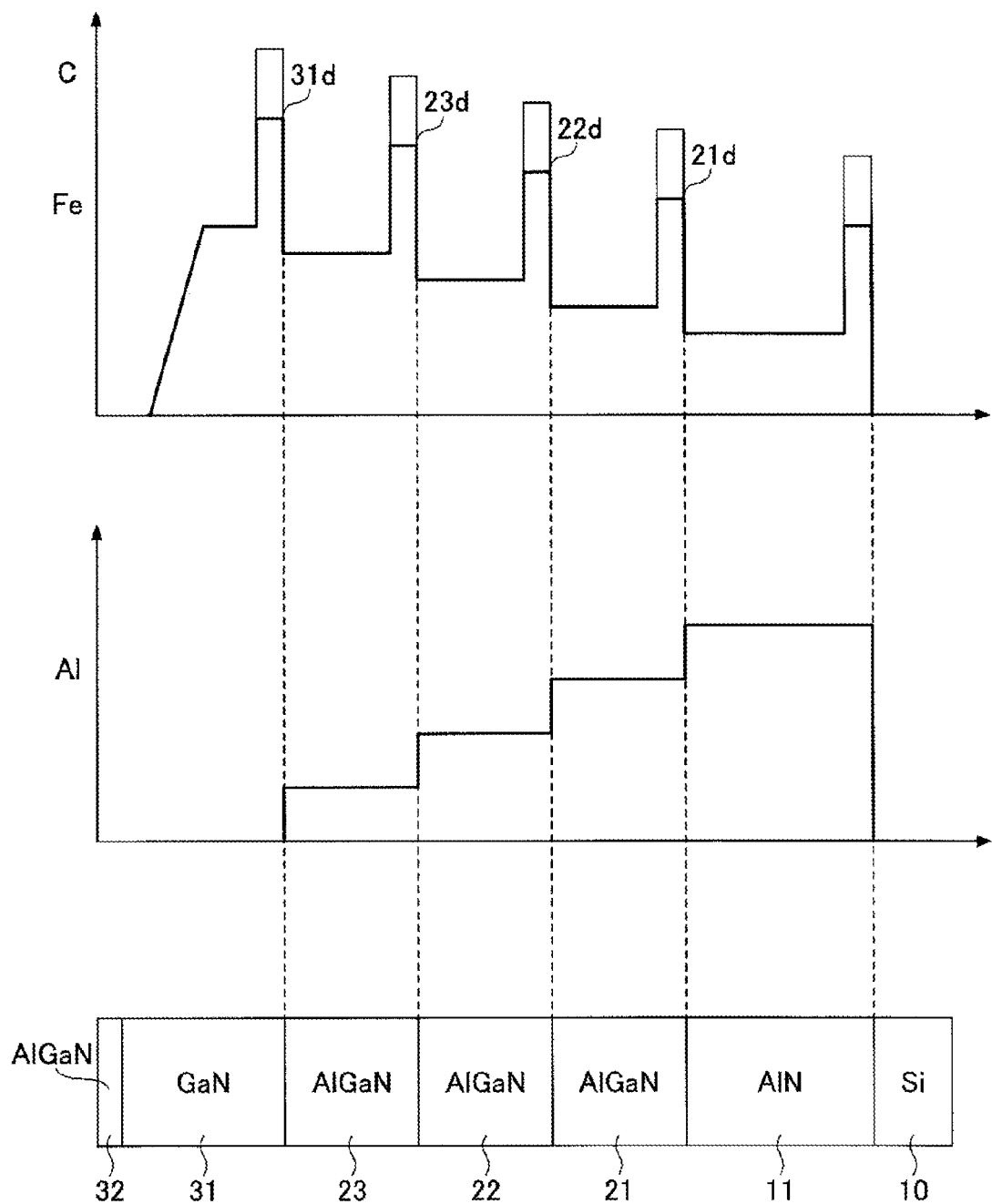
FIG. 16 illustrates a semiconductor apparatus according to a fifth embodiment.

Next, a fifth embodiment is described. In the semiconductor apparatus according to this embodiment, as illustrated in FIG. 16, doping not only with Fe but also with C is performed in the fifth embodiment.

To reduce remaining carriers, it is preferable to dope with Fe at higher concentration. However, due to a difference in atomic radius, if Fe is injected too much, the crystal property may be degraded. To overcome the problem, in this embodiment, not only Fe but also C, which may function similar to Fe, is injected. Specifically, Fe, which is injected into GaN crystal, is substituted for Ga.

However, the covalent radius of Ga is 122 pm (1.22 Å) and the covalent radius of Fe is 132 pm (1.32 Å). Therefore, the difference in the covalent radius between Ga and Fe is 10 pm. On the other hand, C, which is injected into GaN crystal, is substituted for N. The covalent radius of N is 72 pm (0.72 Å) and the covalent radius of C is 73 pm (0.73 Å). Therefore, the difference in the covalent radius between N and C is 1 pm.

Therefore, the difference in covalent radius between C and N is smaller than that between Fe and Ga by one order of magnitude. Accordingly, when an impurity element is doped into GaN, it is preferable to dope with C rather than with Fe to prevent the degradation of the crystal property. Therefore, in this embodiment, by doping with both Fe and C at the same time, the dopant amount of Fe may be reduced and the degradation of the crystal property may be prevented.

In this embodiment, the nucleation layer 11 is formed of AlN that is doped with Fe at concentration of approximately $5\times10^{17}$ $cm_{-3}$. The first buffer layer 21 is formed of $Al_{0.8}Ga_{0.2}N$ with Fe doped concentration of approximately $1\times10^{18}$ $cm_{-3}$. In the first buffer layer 21, in the vicinity of the interface between the nucleation layer 11 and the first buffer layer 21, there is formed a region 21d that is doped with a Fe concentration of $2.5\times10^{18}$ $cm_{-3}$ and is doped with a C concentration of $7.5\times10^{18}$ $cm_{-3}$. The thickness of the region 21d is in a range from 30 nm to 50 nm.

Further, the second buffer layer 22 is formed of $Al_{0.5}Ga_{0.5}N$ with Fe doped concentration of approximately $5\times10^{18}$ $cm_{-3}$. In the second buffer layer 22, in the vicinity of the interface between the first buffer layer 21 and the second buffer layer 22, there is formed a region 22d doped with a Fe concentration of approximately $1.25\times10^{19}$ $cm_{-3}$ and is doped with a C concentration of $3.75\times10^{19}$ cm$_{-3}$. The thickness of the region 22d is in a range from 30 nm to 50 nm.

Further, the third buffer layer 23 is formed of Al$_{0.2}$Ga$_{0.8}$N with Fe doped concentration of approximately $1\times10^{19}$ cm$_{-3}$. In the third buffer layer 23, in the vicinity of the interface between the second buffer layer 22 and the third buffer layer 23, there is formed a region 23d that is doped with a Fe concentration of $2.5\times10^{19}$ cm$_{-3}$ and is doped with a C concentration of $7.5\times10^{19}$ cm$_{-3}$. The thickness of the region 23d is in a range from 30 nm to 50 nm.

Further, in the electron transit layer 31, there is a region which starts from the interface between the buffer layer 20 and the electron transit layer 31, and extends in the electron transit layer 31. The thickness of this region is approximately 200 nm. This region is doped with a Fe concentration of approximately $2\times10^{19}$ cm$_{-3}$.

Further, there is another region 31d in the electron transit layer 31. The region 31c also starts from the interface between the buffer layer 20 and the electron transit layer 31, and extends in the electron transit layer 31. The region 31d is doped with a Fe concentration of approximately $5.0\times10^{19}$ cm$_{-3}$ and is doped with a C concentration of $1.5\times10^{20}$ cm$_{-3}$. The thickness of the region 31d is in a range from 30 nm to 50 nm.

As a method of forming the regions doped with Fe and C, there is a method in which the supply amount of the source gas for Fe is increased and CBr$_4$ for doping C is simultaneously supplied at each of the timings when the regions are formed where Fe and C are dopants.

Further, as another method, the layers may be formed by preparing conditions where C may become more likely to be introduced into the layers by changing the supply amounts of the group-III source gas and the group-V source gas while the supply amount of the source gas for Fe is increased. By doing this, the semiconductor apparatus in this embodiment may be manufactured. All the steps in this embodiment other than the above are the same as those in the third embodiment.

Sixth Embodiment

Next, a sixth embodiment is described. In the semiconductor apparatus in this embodiment, the compositions in the buffer layer are changed not in a step-wise manner but continuously. Specifically, a buffer layer 120 is formed on the nucleation layer 11 as illustrated in FIG. 17.

In the buffer layer 120, in the direction from the nucleation layer 11 to the electron transit layer 31, the composition ratio of Al is gradually decreased but the Fe concentration is gradually increased. Namely, the buffer layer 120 has composition slopes in which the composition ratio of Al is gradually decreased as the layer is formed and the Fe concentration is increased as the composition ratio of Al decreases.

Figure 17:
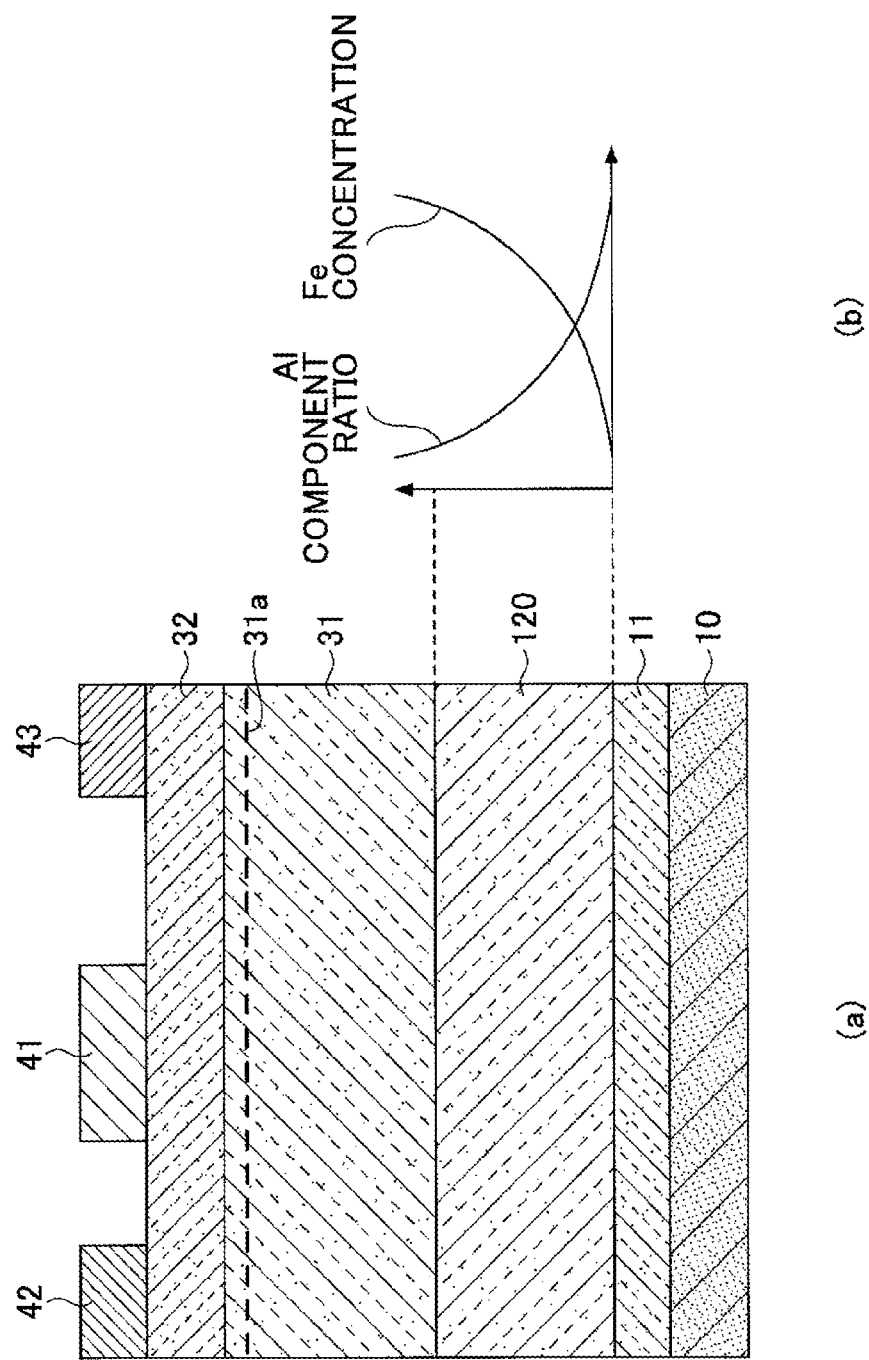
FIG. 17 illustrates a semiconductor apparatus according to a sixth embodiment.

A part (a) of FIG. 17 illustrates an example configuration of the semiconductor apparatus according to this embodiment, and a part (B) of FIG. 17 schematically illustrates the changes in the composition ratio of Al and the Fe concentration.

As described above, by forming the buffer layer 120 so as to have the composition slopes, it may become possible to prevent the generation of carriers more effectively. Here, the configurations other than the above are the same as those in the first embodiment.

Seventh Embodiment

Figure 18:
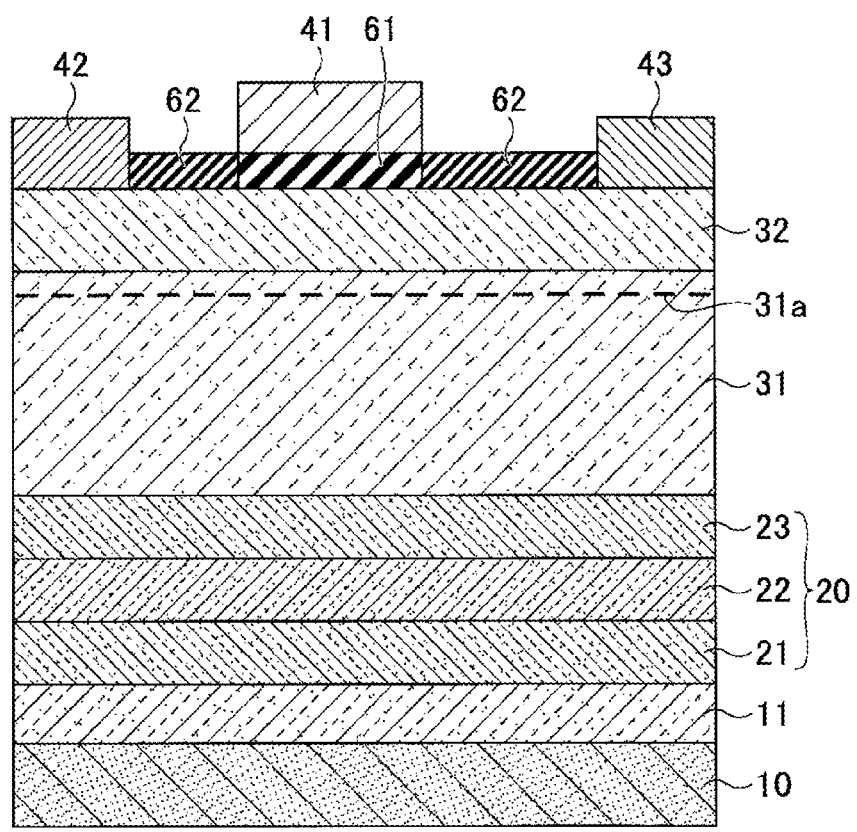
FIG. 18 illustrates a semiconductor apparatus according to a seventh embodiment.

Next, a seventh embodiment is described. In this embodiment, a semiconductor apparatus having a gate isolation film and a protection film is provided. Specifically, as illustrated in FIG. 18, a gate isolation film 61 is formed on the electron supply layer 32 and just under the gate electrode 41. Further, a protection film 62 is formed on the regions where the electron supply layer 32 is exposed. The gate isolation film 61 is formed of aluminum oxide (Al$_2$O$_3$), and the protection film 62 is formed of silicon nitride (SiN).

Eighth Embodiment

Next, an eighth embodiment is described. In this embodiment, a semiconductor device, a power-supply apparatus, and a high-frequency amplifier are described (provided).

Figure 19:
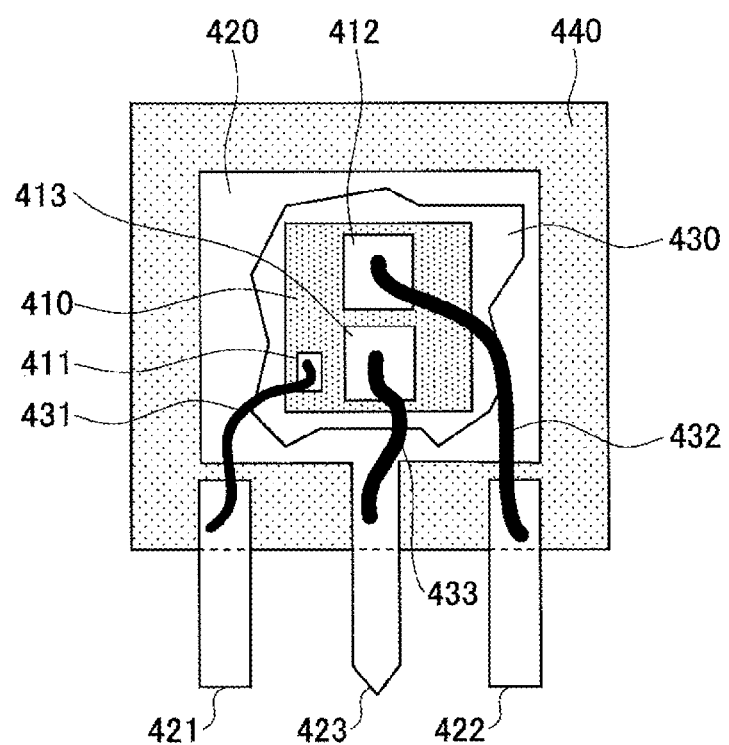
FIG. 19 illustrates a discretely-packaged semiconductor device according to an eighth embodiment.

The semiconductor device in this embodiment herein refers to a discretely-packaged semiconductor apparatus according to the first through seventh embodiments. The discretely-packaged semiconductor apparatus according to the first through seventh embodiments is described with reference to FIG. 19. FIG. 19 schematically illustrates the inside of the discretely-packaged semiconductor apparatus. However, the arrangement of the electrodes differs from that illustrated in the figure in the first through seventh embodiments.

First, an HEMT semiconductor chip 410 using GaN-based semiconductor material is formed by cutting the semiconductor apparatus, which is manufactured according to the first through seventh embodiments, by dicing. Then the semiconductor chip 410 is fixed on a lead frame 420 with a die bonding agent such as solder. Here, the semiconductor chip 410 corresponds to the semiconductor apparatus in the first through seventh embodiments.

Next, a gate electrode 411 is connected to a gate lead 421 with a bonding wire 431, a source electrode 412 is connected to a source lead 422 with a bonding wire 432, and a drain electrode 413 is connected to a drain lead 423 with a bonding wire 433. Here, the bonding wires 431, 432, and 433 are formed of a metal material. Further, in this embodiment, the gate electrode 411 refers to the gate electrode pad which is connected to the gate electrode 41 in the semiconductor apparatus according to the first through seventh embodiments.

Similarly, the source electrode 412 refers to the source electrode pad which is connected to the source electrode 42 in the semiconductor apparatus according to the first embodiment. The drain electrode 413 refers to the drain electrode pad which is connected to the drain electrode 43 in the semiconductor apparatus according to the first through seventh embodiments.

Next, resin-sealing is performed with a molded resin 440 by the transfer molded method. By doing this, it becomes possible to manufacture the discretely-packaged semiconductor device of the HEMT using GaN-based semiconductor material.

Next, a power-supply apparatus and a high-frequency amplifier according to this embodiment are described. The power-supply apparatus and the high-frequency amplifier according to this embodiment refer to the power-supply apparatus and the high-frequency amplifier using the semiconductor apparatus according to the first through seventh embodiments.

Figure 20:
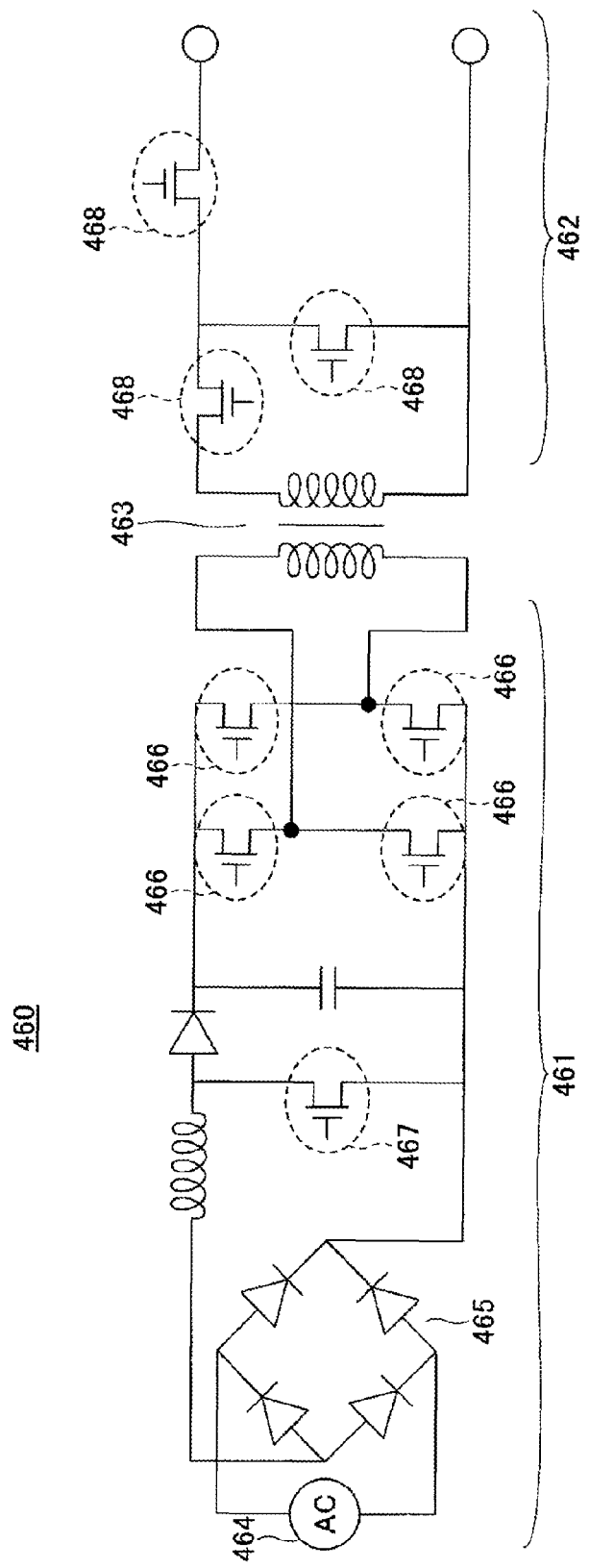
FIG. 20 illustrates an example circuit diagram of a power-supply apparatus according to the eight embodiment.

First, with reference to FIG. 20, the power-supply apparatus according to this embodiment is described. The power-supply apparatus 460 includes a high-voltage primary circuit 461, a low-voltage secondary circuit 462, and a transformer 463 which is disposed between the primary circuit 461 and the secondary circuit 462.

The primary circuit 461 includes an alternating-current (AC) source 464, a so-called "bridge rectifier circuit" 465, a plurality of switching devices (four switching devices in the example of FIG. 20) 466, a switching device 467 and the like.

The secondary circuit 462 includes a plurality of switching devices (three switching devices in the example of FIG. 20) 468 and the like. In the example of FIG. 10, the semiconductor apparatus according to the first embodiment is used as the switching devices 466 and 467. Here, it is desired that the switching devices 466 and 467 in the primary circuit 461 be normally-off semiconductors. As the switching devices 468 used in the secondary circuit 462, typical metal insulator semiconductor field effect transistors (MISFET) formed of silicon are used.

Figure 21:
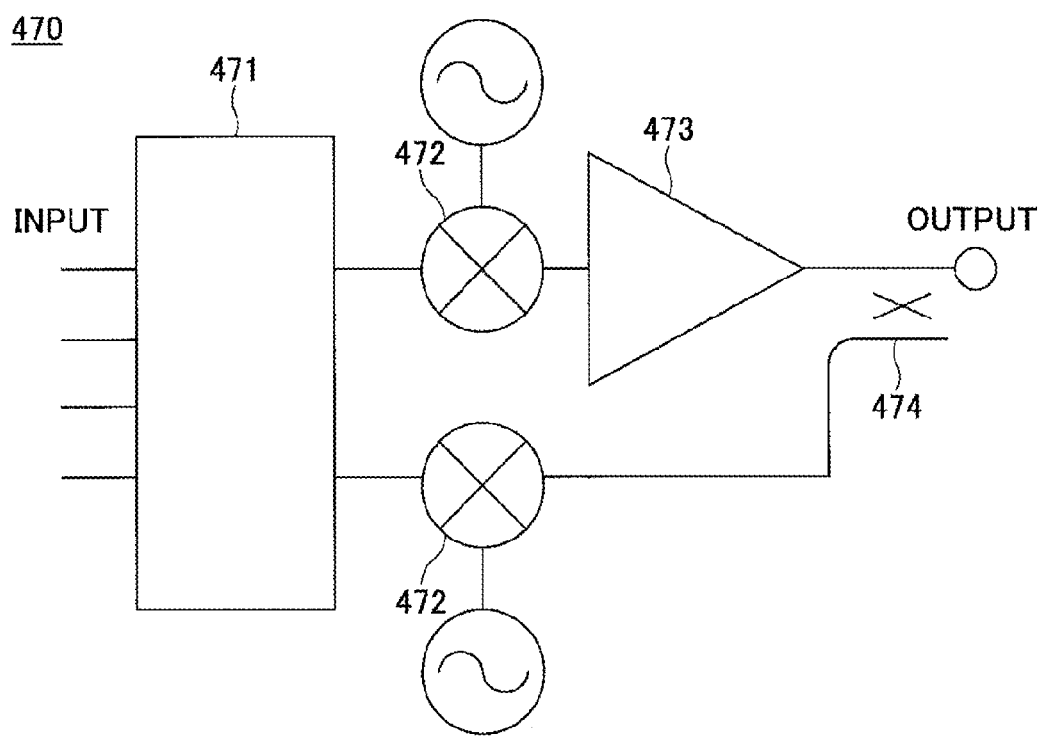
FIG. 21 illustrates an example configuration a high-power amplifier according to the eighth embodiment.

Next, with reference to FIG. 21, the high-frequency amplifier according to this embodiment is described. The high-frequency amplifier 470 according to this embodiment may be used as, for example, a high-power amplifier for a base station of cellular phones. The high-frequency amplifier 470 includes a digital predistortion circuit 471, a mixers 472, a power amplifier 473, and a directional coupler 474.

The digital predistortion circuit 471 compensates for non-linear distortion of the input signals. The mixer 472 mixes the input signals, whose non-linear distortion has been compensated for, with an AC signal. The power amplifier 473 amplifies the input signal that has been mixed with the AC signal. In the example of FIG. 21, the power amplifier 473 includes the semiconductor apparatus according to the first embodiment. The directional coupler 474 performs monitoring on the input signal and the output signal and the like.

In the circuit of FIG. 11, by a switching operation, the output signal may be mixed with the AC signal by the mixer 472 and transmitted to the digital predistortion circuit 471.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority or inferiority of the invention. Although the embodiment of the present inventions has been described in detail, it is to be understood that various changes, substitutions, and alterations could be made hereto without departing from the sprit and scope of the invention.

What is claimed is:

1. A semiconductor apparatus comprising:
   a substrate;
   a buffer layer formed on the substrate;
   a first semiconductor layer formed on the buffer layer;
   a second semiconductor layer formed on the first semiconductor layer; and
   a gate electrode, a source electrode, and a drain electrode formed on the second semiconductor layer,
   wherein the buffer layer is formed of AlGaN and doped with Fe,
   wherein the buffer layer includes a plurality of layers having different Al component ratios from each other, and
   wherein, when a first layer of the layers is closer to the substrate than a second layer of the layers and the second layer is closer to the first semiconductor layer than the first layer, the Al component ratio of the first layer is greater than the Al component ratio of the second layer and the Fe concentration of the first layer is less than the Fe concentration of the second layer.

2. A semiconductor apparatus comprising:
   a substrate;
   a buffer layer formed on the substrate;
   a first semiconductor layer formed on the buffer layer;
   a second semiconductor layer formed on the first semiconductor layer; and
   a gate electrode, a source electrode, and a drain electrode formed on the second semiconductor layer,
   wherein the buffer layer is formed of AlGaN and doped with at least one of Fe, Si, and C,
   wherein, in the first semiconductor layer, a region which is disposed on the buffer layer side is doped with Fe, and
   wherein a Fe concentration in the region is higher than a concentration of the at least one of Fe, Si, and C in the buffer layer.

3. The semiconductor apparatus according to claim 2,
   wherein the buffer layer includes a plurality of layers having different Al component ratios from each other, and
   wherein, when a first layer of the layers is closer to the substrate than a second layer of the layers and the second layer is closer to the first semiconductor layer than the first layer, the Al component ratio of the first layer is greater than the Al component ratio of the second layer and the Fe concentration of the first layer is less than the Fe concentration of the second layer.

4. The semiconductor apparatus according to claim 1, wherein a number of the plurality of layers is three or more.

5. The semiconductor apparatus according to claim 4, wherein the plurality of layers are arranged such that the Al component ratio decreases and the Fe concentration increases in a direction from a substrate side to a first semiconductor layer side.

6. The semiconductor apparatus according to claim 1, wherein, in each of the layers of the buffer layer, the Fe concentration in a region near an interface between the layers is higher than the Fe concentration in any region other than the region near the interface.

7. The semiconductor apparatus according to claim 6, wherein when a given layer of the layers is adjacent to another layer of the layers and a first region of the given layer faces a second region of the other layer via an interface, the Fe concentration of one of the first and second regions belonging to one of the given layer and the other layer that has a narrower band gap is greater than the Fe concentration of any other region in the one of the given layer and the other layer.

8. The semiconductor apparatus according to claim 7, wherein the one of the first and second regions is doped with Si as well as Fe.

9. The semiconductor apparatus according to claim 7, wherein the one of the first and second regions is doped with C as well as Fe.

10. A semiconductor apparatus comprising:
    a substrate;
    a buffer layer formed on the substrate;
    a first semiconductor layer formed on the buffer layer;
    a second semiconductor layer formed on the first semiconductor layer; and
    a gate electrode, a source electrode, and a drain electrode formed on the second semiconductor layer,
    wherein the buffer layer is formed of AlGaN and is doped with at least one of Fe, Si, and C, and
    wherein, in the buffer layer, an Al component ratio gradually decreases and a concentration of at least one of Fe, Si, and C gradually increases in a direction from a substrate side to a first semiconductor layer side.

11. The semiconductor apparatus according to claim 1, wherein the Fe concentration in the buffer layer is in a range from $5\times10^{16}$ cm$^{-3}$ to $2\times10^{20}$ cm$^{-3}$.

12. The semiconductor apparatus according to claim 1, wherein the substrate is a silicon substrate.

13. The semiconductor apparatus according to claim 1, wherein in the buffer layer, one of the layers closest to the substrate is a nucleation layer formed of AlN.

14. The semiconductor apparatus according to claim 1, wherein the first semiconductor layer is formed of a material including GaN.

15. The semiconductor apparatus according to claim 1, wherein the second semiconductor layer is formed of a material including AlGaN.

16. The semiconductor apparatus according to claim 1, wherein the buffer layer, the first semiconductor layer, and the second semiconductor layer are formed by MOVPE (Metal Organic Vapor Phase Epitaxy).

17. The semiconductor apparatus according to claim 1, further comprising:
an isolation film formed between the second semiconductor layer and the gate electrode.

18. A power-supply apparatus comprising:
the semiconductor apparatus according to claim 1.

19. An amplifier comprising:
the semiconductor apparatus according to claim 1.

* * * * *

UNITED STATES PATENT AND TRADEMARK OFFICE
CERTIFICATE OF CORRECTION

PATENT NO.       : 9,029,868 B2                                          Page 1 of 1
APPLICATION NO.  : 13/935821
DATED            : May 12, 2015
INVENTOR(S)      : Junji Kotani It is certified that error appears in the above-identified patent and that said Letters Patent is hereby corrected as shown below:

Claims

In Claim 10, Column 16, Line 48, "wherein the buffer layer is formed of AlGaN and is doped" should read --wherein the buffer layer is formed of AlGaN and is doped--.

In Claim 13, Column 16, Line 61, "substrate is a nucleation layer formed of AlN." should read --substrate is a nucleation layer formed of AlN.--.

Signed and Sealed this
Sixth Day of October, 2015

Michelle K. Lee
*Director of the United States Patent and Trademark Office*